(12) United States Patent
Yuasa

(10) Patent No.: US 11,233,193 B2
(45) Date of Patent: *Jan. 25, 2022

(54) METHOD OF MANUFACTURING A MAGNETORESTIVE RANDOM ACCESS MEMEORY (MRAM)

(71) Applicants: Japan Science and Technology Agency, Kawaguchi (JP); National Institute of Advanced Industrial Science and Technology, Tokyo (JP)

(72) Inventor: Shinji Yuasa, Ibaraki (JP)

(73) Assignees: JAPAN SCIENCE AND TECHNOLOGY AGENCY, Kawaguchi (JP); NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/862,598

(22) Filed: Apr. 30, 2020

(65) Prior Publication Data

US 2020/0259077 A1     Aug. 13, 2020

Related U.S. Application Data

(63) Continuation of application No. 16/443,875, filed on Jun. 18, 2019, now Pat. No. 10,680,167, which is a
(Continued)

(30) Foreign Application Priority Data

Mar. 12, 2004    (JP) .................................. 2004-071186
Oct. 20, 2004    (JP) .................................. 2004-313350

(51) Int. Cl.
    *H01L 21/02*      (2006.01)
    *H01L 21/00*      (2006.01)
(Continued)

(52) U.S. Cl.
    CPC .............. *H01L 43/10* (2013.01); *B82Y 25/00* (2013.01); *G11C 11/15* (2013.01); *G11C 11/16* (2013.01);
(Continued)

(58) Field of Classification Search
    CPC ......... H01L 43/08; H01L 43/10; H01L 43/02; H01L 43/12; H01L 27/222; H01L 27/288;
(Continued)

(56) References Cited

U.S. PATENT DOCUMENTS 5,239,504 A    8/1993   Brady et al.
5,506,063 A    4/1996   Kamijo et al.
(Continued)

FOREIGN PATENT DOCUMENTS

EP      0 145 403      6/1985
EP      1 061 592      12/2000
(Continued)

OTHER PUBLICATIONS

Yuasa, S. et al., "Giant tunnel magnetoresistance in magnetic tunnel junctions with a crystalline MgO(001) barrier", Journal of Physics D: Applied Physics, 40, (2007), R337-R354, which is Evidence Otsu 29 (Evidence submitted by the Defendant 29) for 2014(wa)25200 Case of Ciaiming Damages in Japan, already submitted as IDS on Aug. 12, 2019.
(Continued)

*Primary Examiner* — Alonzo Chambliss
(74) *Attorney, Agent, or Firm* — Xsensus LLP

(57) ABSTRACT

A method of manufacturing a magnetoresistive random access memory (MRAM). The method includes forming a first CoFeB layer of the MTJ devices, the first CoFeB layer being amorphous and forming a magnesium oxide (MgO) layer of the MTJ devices over the first CoFeB layer. Further, there is a forming of a second CoFeB layer of the MTJ
(Continued)

devices, the second CoFeB layer being amorphous over the MgO layer, and annealing the MTJ devices. The first and second CoFeB layers are crystallized by the annealing, and the MgO layer is poly-crystalline in which a (001) crystal plane is preferentially oriented.

20 Claims, 10 Drawing Sheets

Related U.S. Application Data continuation of application No. 15/428,842, filed on Feb. 9, 2017, now Pat. No. 10,367,138, which is a continuation of application No. 14/837,558, filed on Aug. 27, 2015, now Pat. No. 9,608,198, which is a continuation of application No. 13/767,290, filed on Feb. 14, 2013, now Pat. No. 9,123,463, which is a continuation of application No. 13/400,340, filed on Feb. 20, 2012, now Pat. No. 8,405,134, which is a continuation of application No. 12/923,643, filed on Sep. 30, 2010, now Pat. No. 8,319,263, which is a continuation of application No. 10/591,947, filed as application No. PCT/JP2005/004720 on Mar. 10, 2005, now Pat. No. 7,884,403.

(51) Int. Cl.

| | |
|---|---|
| H01L 43/10 | (2006.01) |
| H01F 10/13 | (2006.01) |
| G11C 11/15 | (2006.01) |
| H01L 49/02 | (2006.01) |
| H01L 27/11507 | (2017.01) |
| B82Y 25/00 | (2011.01) |
| G11C 11/16 | (2006.01) |
| H01L 27/22 | (2006.01) |
| H01L 43/08 | (2006.01) |
| H01L 43/12 | (2006.01) |
| H01F 10/32 | (2006.01) |
| H01L 43/02 | (2006.01) |
| B82Y 10/00 | (2011.01) |

(52) U.S. Cl.
CPC .......... *G11C 11/161* (2013.01); *H01F 10/132* (2013.01); *H01F 10/3254* (2013.01); *H01L 27/11507* (2013.01); *H01L 27/222* (2013.01); *H01L 27/228* (2013.01); *H01L 28/55* (2013.01); *H01L 43/02* (2013.01); *H01L 43/08* (2013.01); *H01L 43/12* (2013.01); *B82Y 10/00* (2013.01); *H01L 27/22* (2013.01)

(58) Field of Classification Search
CPC ... H01L 27/11507; G11C 11/16; G11C 11/15; G11C 11/161; H01F 10/3254; H01F 10/132; B82Y 25/00
See application file for complete search history.

(56) References Cited

U.S. PATENT DOCUMENTS

| | | |
|---|---|---|
| 5,514,484 A | 5/1996 | Nishimoto |
| 5,759,265 A | 6/1998 | Nashimoto et al. |
| 5,800,635 A | 9/1998 | Collins et al. |
| 5,817,366 A | 10/1998 | Arai et al. |
| 5,945,694 A | 8/1999 | Reyes et al. |
| 6,054,226 A | 4/2000 | Takeda et al. |
| 6,181,537 B1 | 1/2001 | Gill |
| 6,201,672 B1 | 3/2001 | Pinarbasi |
| 6,252,750 B1 | 6/2001 | Gill |
| 6,275,362 B1 | 8/2001 | Pinarbasi |
| 6,379,978 B2 | 4/2002 | Goebel et al. |
| 6,544,801 B1 | 4/2003 | Slaughter et al. |
| 6,621,730 B1* | 9/2003 | Lage ........ H01L 43/12 365/158 |
| 6,767,655 B2 | 7/2004 | Hiramoto et al. |
| 6,819,586 B1 | 11/2004 | Anthony et al. |
| 6,828,260 B2 | 12/2004 | Sharma et al. |
| 6,831,312 B2 | 12/2004 | Slaughter et al. |
| 6,839,206 B2 | 1/2005 | Saito et al. |
| 6,911,685 B2 | 6/2005 | Anthony et al. |
| 6,927,952 B2 | 8/2005 | Shimizu et al. |
| 6,999,287 B2 | 2/2006 | Hayashi et al. |
| 7,149,105 B2 | 12/2006 | Brown |
| 7,220,498 B2 | 5/2007 | Nagahama et al. |
| 7,252,852 B1 | 8/2007 | Parkin |
| 7,262,064 B2 | 8/2007 | Ohba et al. |
| 7,270,896 B2 | 9/2007 | Parkin |
| 7,276,384 B2 | 10/2007 | Parkin et al. |
| 7,408,749 B2 | 8/2008 | Gill |
| 7,443,639 B2 | 10/2008 | Parkin |
| 7,453,672 B2 | 11/2008 | Dieny et al. |
| 7,570,463 B2 | 8/2009 | Parkin |
| 7,598,555 B1 | 10/2009 | Parkin |
| 7,884,403 B2 | 2/2011 | Yuasa |
| 8,091,209 B1 | 1/2012 | Gao et al. |
| 8,294,228 B2 | 10/2012 | Peng et al. |
| 8,319,263 B2 | 11/2012 | Yuasa |
| 8,405,134 B2 | 3/2013 | Yuasa |
| 9,123,463 B2 | 9/2015 | Yuasa |
| 9,608,198 B2 | 3/2017 | Yuasa |
| 10,367,138 B2* | 7/2019 | Yuasa ............... H01L 27/11507 |
| 10,680,167 B2* | 6/2020 | Yuasa ................ G11C 11/161 |
| 2002/0064069 A1 | 5/2002 | Goebel et al. |
| 2002/0064595 A1 | 5/2002 | Nomura et al. |
| 2002/0080641 A1 | 6/2002 | Asao et al. |
| 2002/0149962 A1 | 10/2002 | Horiguchi |
| 2002/0159203 A1 | 10/2002 | Saito et al. |
| 2002/0191355 A1 | 12/2002 | Hiramoto et al. |
| 2003/0080363 A1 | 5/2003 | Maruyama et al. |
| 2003/0128483 A1 | 7/2003 | Kamijo |
| 2003/0203189 A1 | 10/2003 | Futamoto et al. |
| 2004/0001372 A1 | 1/2004 | Higo et al. |
| 2004/0082201 A1 | 4/2004 | Sharma et al. |
| 2004/0136232 A1 | 7/2004 | Hosomi et al. |
| 2004/0139914 A1 | 7/2004 | Yamazaki et al. |
| 2004/0144995 A1 | 7/2004 | Nagahama et al. |
| 2004/0234818 A1 | 11/2004 | Tanahashi et al. |
| 2004/0245553 A1 | 12/2004 | Hosomi et al. |
| 2004/0257719 A1 | 12/2004 | Ohba et al. |
| 2005/0047027 A1 | 3/2005 | Lin et al. |
| 2005/0110004 A1 | 5/2005 | Parkin et al. |
| 2005/0207071 A1 | 9/2005 | Sato et al. |
| 2006/0003185 A1 | 1/2006 | Parkin |
| 2006/0012926 A1 | 1/2006 | Parkin |
| 2006/0049441 A1 | 3/2006 | Janesky et al. |
| 2006/0056115 A1 | 3/2006 | Djayaprawira et al. |
| 2006/0125034 A1 | 6/2006 | Ohba et al. |
| 2006/0261425 A1 | 11/2006 | Suemitsu et al. |
| 2007/0128470 A1 | 6/2007 | Nagahama et al. |
| 2007/0195592 A1 | 8/2007 | Yuasa |
| 2007/0258170 A1 | 11/2007 | Yuasa |
| 2008/0055793 A1 | 3/2008 | Djayaprawira et al. |
| 2008/0062581 A1 | 3/2008 | Parkin |
| 2008/0124454 A1 | 5/2008 | Djayaprawira et al. |
| 2008/0180862 A1 | 7/2008 | Djayaprawira et al. |
| 2008/0182342 A1 | 7/2008 | Parkin |
| 2008/0212243 A1 | 9/2008 | Zhao et al. |
| 2008/0253039 A1 | 10/2008 | Nagamine et al. |
| 2009/0128167 A1 | 5/2009 | Hamada et al. |
| 2009/0324814 A1 | 12/2009 | Parkin |

FOREIGN PATENT DOCUMENTS

| | | |
|---|---|---|
| EP | 1 085 586 | 3/2001 |
| EP | 1 391 942 | 5/2002 |
| EP | 1 494 295 | 1/2005 |
| EP | 1 633 007 | 3/2006 |
| EP | 1 793 434 | 6/2007 |
| JP | H05-144729 | 6/1993 |

(56) References Cited

FOREIGN PATENT DOCUMENTS

| | | |
|---|---|---|
| JP | H08-181289 A | 7/1996 |
| JP | 11-097766 | 4/1999 |
| JP | 2000-030236 | 1/2000 |
| JP | 2001-23140 A | 1/2001 |
| JP | 2001-101645 | 4/2001 |
| JP | 2002-204004 | 7/2002 |
| JP | 2002-246567 | 8/2002 |
| JP | 2002-270790 | 9/2002 |
| JP | 2002-270921 | 9/2002 |
| JP | 2002-289943 | 10/2002 |
| JP | 2002-319722 | 10/2002 |
| JP | 2002-540594 T | 11/2002 |
| JP | 2002-359413 | 12/2002 |
| JP | 2003-86863 | 3/2003 |
| JP | 2003-133531 A | 5/2003 |
| JP | 2003-283001 | 10/2003 |
| JP | 2003-304010 | 10/2003 |
| JP | 2003-304012 | 10/2003 |
| JP | 2003-318465 | 11/2003 |
| JP | 2003-318465 A | 11/2003 |
| JP | 2004-022599 | 1/2004 |
| JP | 2004022599 | 1/2004 |
| JP | A-2004-31605 | 1/2004 |
| JP | 2004-063592 | 2/2004 |
| JP | 2004-128015 | 4/2004 |
| JP | 2004-153258 | 5/2004 |
| JP | 2004-227667 A | 8/2004 |
| JP | 2006-080116 | 3/2006 |
| JP | 2006-196612 A | 7/2006 |
| JP | 2008-004956 | 1/2008 |
| JP | 2008-4956 A | 1/2008 |
| JP | 2009-21626 A | 1/2009 |
| JP | 4774092 B2 | 9/2011 |
| JP | 4963744 B2 | 6/2012 |
| JP | 5002788 B2 | 8/2012 |
| JP | 5120680 B2 | 1/2013 |
| JP | 5152734 B2 | 2/2013 |
| KR | 2002-0042448 | 6/2002 |
| KR | 2003-0097904 | 12/2003 |
| WO | WO 01/056090 | 8/2001 |
| WO | WO 2002/099905 | 5/2002 |
| WO | WO 2003/085750 | 10/2003 |
| WO | WO 2004/025744 | 3/2004 |
| WO | 2005/88745 A1 | 9/2005 |
| WO | WO 2005/088745 | 9/2005 |

OTHER PUBLICATIONS

Tsunoda, M. et al., "Orientational Control of Barrier Layer with Interfacial Modification and Its Effect on Tunnel Magnetoresistance in CoFeB/MgO/CoFeB Magnetic Tunnel Junctions", Journal of Vacuum Society of Japan, vol. 51, No. 9, (2008), pp. 583-588, which is Evidence Otsu 38 (Evidence submitted by the Defendant 38) for 2014(wa)25200 Base of Claiming Damages in Japan, with English machine translation.

Yuasa, S. et al., "High Tunnel Magnetoresistance at Room Temperature in Fully Epitaxial Fe/MgO/Fe Tunnel Junctions due to Coherent Spin-Polarized Tunneling", Japanese Journal of Applied Physics, vol. 43, No. 4B, (2004), pp. L588-L590, which is Evidence Otsu 48 (Evidence submitted by the Defendant 48) for 2014(wa)25200 Case of Claiming Damages in Japan, already submitted as IDS on Aug. 12, 2019.

Defendant Technical briefing Documents p. 42-p. 67, which is Evidence Otsu 55 (Evidence submitted by the Defendant 55) for 2014(wa)25200 Case of Claiming Damages in Japan, with English translation.

Yuasa, S. et al., "Tunneling Magnetoresistance and Interface Structure of Magnetic Tunnel Junctions with a MgO (001) Barrier", Surface Science vol. 28, No. 1, pp. 15-21, 2007, which is Evidence Otsu 56 (Evidence submitted by the Defendant 56) for 2014(wa)25200 Case of Claiming Damages in Japan, with English machine translation.

"Part VI Chapter 1 Section 1" of "Examination Guidelines for Patent and Utility Model in Japan" of Sep. 2015, which is Evidence Otsu 60 (Evidence submitted by the Defendant 60) for 2014(wa)25200 Case of Claiming Damages in Japan, with English translation.

Machida, K. et al., "Spatial Light Modulator with Tunnel Magnetoresistance Driven by Spin Transfer Switching—Toward the Development of a 3D Television System with Low Power Consumption-", NHJ STRL R&D, No. 138, (2013) pp.51-60, which is Evidence Otsu 65 (Evidence submitted by the Defendant 65) for 2014(wa)25200 Case of Claiming Damages in Japan, with English machine translation.

Machida, K. et al., "Magnetic tunnel junctions using Co/Pt multilayered free layers with perpendicular magnetic anisotropy", Journal of Physics: Conference Series, 303, (2011). 012100, which is an original paper of Machida, K. et al., NHK STRL R&D, No. 138, (2013), pp. 51-60.

Defendant Preliminary Documents (1) p. 33 line 11-p. 57 submitted on Jan. 30, 2015 for 2014(wa)25200 Case of Claiming Damages in Japan, with English machine translation.

Plaintiffs Preliminary Documents (1) p. 69-p. 74 submitted on Mar. 13, 2015 for 2014(wa)25200 Case of Claiming Damages in Japan, with English machine translation.

Defendant Preliminary Documents (2) p. 23 line 16-p. 46 submitted on Jun. 4, 2015 for 2014(wa)25200 Case of Claiming Damages in Japan, with English machine translation.

Plaintiffs Preliminary Documents (2) p. 31 Sine 13-p. 32 submitted on Jul. 23, 2015 for 2014(wa)25200 Case of Claiming Damages in Japan, with English machine translation.

Defendant Preliminary Documents (3) p. 47 line 14-p. 79 submitted on Oct. 1, 2015 for 2014(wa)25200 Case of Claiming Damages in Japan, with English machine translation.

Plaintiffs Preliminary Documents (4) p. 2-p. 16 submitted on November 2.0, 2015 for 2014(wa)25200 Case of Claiming Damages in Japan, with English machine translation.

Defendant Preliminary Documents (5) p. 5-p. 39 submitted on Feb. 5, 2016 for 2014(wa)25200 Case of Claiming Damages in Japan, with English machine translation.

Plaintiffs Preliminary Documents (6) submitted on Mar. 4, 2016 for 2014(wa)25200 Case of Claiming Damages in Japan, with English machine translation.

Defendant Preliminary Documents (7) p. 4-p. 23 submitted on Apr. 4, 2016 for 2014(wa)25200 Case of Claiming Damages in Japan, with English machine translation.

Defendant Preliminary Documents (10) p. 4 line 4 from the bottom-p. 8 line 3 from the bottom and p. 23 line 9-p. 24 submitted on Jul. 29, 2016 for2014(wa)25200 Case of Claiming Damages in Japan, with English machine translation.

Plaintiffs Preliminary Documents (9) p. 8-p. 14 line 13 and p. 18 line 19-p. 22 submitted on Aug. 9, 2016 for 2014(wa)25200 Case of Claiming Damages in Japan, with English machine translation.

Defendant Preliminary Documents (11) p. 17 line 3-p. 21 line 5 from the bottom and p. 22 line 5-p. 27 line 12 submitted on Oct. 14, 2 016 for 2014(wa)25200 Case of Claiming Damages in Japan, with English machine translation.

Plaintiffs Preliminary Documents (10) p. 8-p. 10 submitted on Oct. 21, 2016 for 2014(wa)25200 Case of Claiming Damages in Japan, with English machine translation.

Plaintiffs Preliminary Documents (11) p. 2-p. 8 and p. 15 p. 19 submitted on Nov. 18, 2016 for 2014(wa)25200 Case of Claiming Damages in Japan, with English machine translation.

Defendant Preliminary Documents (12) p. 10 line 5-p. 14 line 8 and p. 16-p. 35 submitted on Jan. 20, 2017 for 2014(wa)25200 Case of Claiming Damages in Japan, with English machine translation.

Plaintiffs Preliminary Documents (12) p. 12-p. 16 submitted on Jan. 25, 2017 for 2014(wa)25200 Case of Claiming Damages in Japan, with English machine translation.

Plaintiffs Preliminary Documents (13) submitted on Jan. 26, 2017 for 2014(wa)25200 Case of Claiming Damages in Japan, with English machine translation.

Defendant Preliminary Documents(13) p. 3 line 6-p. 6 line 6 from the bottom and p. 8 line 13-p. 19 submitted on Mar. 17, 2017 for 2014(wa)25200 Case of Claiming Damages in Japan, with English machine translation.

(56) References Cited

OTHER PUBLICATIONS

Plaintiffs Preliminary Documents (16) p. 6 line 21-p. 7 submitted on Aug. 25, 2017 for 2014(wa)25200 Case of Claiming Damages in Japan, with English machine translation.
Defendant Preliminary Documents(15) p. 2 line 3 from the bottom-p. 3 line 7 submitted on Sep. 19, 2017f or 2014(wa)25200 Case of Claiming Damages in Japan, with English machine translation.
Defendant Preliminary Documents (19) p. 15 line 9-p. 19 submitted on Apr. 13, 2018 for 2014(wa)25200 Case of Claiming Damages in Japan, with English machine translation.
Plaintiffs Preliminary Documents (20) p. 3 line 7 from the bottom-p. 6 submitted on Apr. 17, 2018 for 2014(wa) 25200 Case of Claiming Damages in Japan, with English machine translation.
Plaintiffs Preliminary Documents (22) submitted on Jul. 20, 2018 for 2014(wa)25200 Case of Claiming Damages in Japan, with English machine translation.
Plaintiffs Preliminary Documents (23) submitted on Aug. 9, 2018 for 2014(wa)25200 Case of Claiming Damages in Japan, with English machine translation.
Defendant Preliminary Documents (21) submitted on Sep. 14, 2018 for 2014(wa)25200 Case of Claiming Damages in Japan, with English machine translation.
Yuasa, S., "Recent Developments of Spintronics Device Technologies Based on Magnetic Tunnel Junctions with Magnesium Oxide Tunnel Barrier", IEEJ Transactions on Electronics, Information and Systems, vol. 133, No. 3, p. 471-478, which is Attachment(1) of Evidence Kou 11 (Evidence submitted by the Plaintiffs 11) for 2014(wa)25200 Case of Claiming Damages in Japan, with English machine translation.
Plaintiffs Technical briefing Documents p. 26-p. 30, which is Evidence Kou 38 (Evidence submitted by the Plaintilfs 38) for 2014(wa)25200 Case of Claiming Damages in Japan, with English machine translation.
Yuasa, S. et al., "Giant Room-Temperature Magnetoresistance in Single-Crystal Fe/MgO/Fe Magnetic Tunnel Junctions", Nature Materials, vol. 3, (Oct. 31, 2004), pp. 868-871, which is Evidence Kou 41 (Evidence submitted by the Plaintiffs 41) for 2014(wa)25200 Case of Claiming Damages in Japan, already submitted as IDS on Aug. 12, 2019.
Dong, K.F. et, al., "Nanocomposite L10 FePt—SiNx and FePt—SiNx—C films with large coercivity and small grain size on a TiN intermediate layer", Journal of Magnetism and Magnetic Materials, 324, (2012), 2637-2644, which is Evidence Kou 45 (Evidence submitted by the Plaintiffs 45) for 2014(wa)25200 Case of Claiming Damages in Japan.
Research report (7) p. 8- p. 12 line14, which is Evidence Kou 47 (Evidence submitted by the Plaintiffs 47) for 2014(wa)25200 Case of Claiming Damages in Japan, with English machine translation.
Decision on Appeal (Correction 2016-390151) on Jan. 17, 2017 for Japanese Patent No. 4963744, which is Evidence Kou 48 (Evidence submitted by the Plaintiffs 48) for 2014(wa)25200 Case of Claiming Damages in Japan, with English machine translation.
Decision on Appeal (Correction 2017-390051) on Aug. 17, 2017 for Japanese Patent No. 5120680, which is Evidence Kou 57 (Evidence submitted by the Plaintiffs 57) for 2014(wa)25200 Case of Claiming Damages in Japan, with English machine translation.
Hayakawa J. et al., "Dependence of Giant Tunnel Magneloresistance of Sputtered CoFeB/MgO/CoFeB Magnetic funnel Junctions on MgO Barrier Thickness and Annealing Temperature", Japanese Journal of Applied Physics, vol. 14, No. 19, (2005), pp. L587-L589, which is Evidence Kou 58 (Evidence submitted by the Plaintiffs 58) for 2014(wa) 25200 Case of Claiming Damages in Japan.
Written Statement submitted on Aug. 10, 2007 for Japanese Patent Application No. 2006-511062, which is Evidence Otsu 3-2 (Evidence submitted by the Defendant 3-2) for 2014(wa)25200 Case of Claiming Damages in Japan, with English machine translation.
Written Statement submitted on Aug. 10, 2007 for Japanese Patent Application No. 2007-210197, which is Evidence Otsu 4 (Evidence submitted by the Defendant 4) for 2014(wa)25200 Case of Claiming Damages in Japan, with English machine translation.
Notice of Reasons for Refusal drafted on Dec. 8, 2010 for Japanese Patent Application No. 2008-238154, which is Evidence Otsu 5-1 (Evidence submitted by the Defendant 5-1) for 2014(wa)25200 Case of Claiming Damages in Japan, with English machine translation.
Written Statement submitted on Nov. 11, 2011 for Japanese Patent Application No. 2011-226906, which is Evidence Otsu 6-1 (Evidence submitted by the Defendant 6-1) for 2014(wa)25200 Case of Claiming Damages in Japan, with English machine translation.
Written Opinion submitted on Mar. 23, 2012 for Japanese Patent Application No. 2011-226907, which is Evidence Otsu 7-1 (Evidence submitted by the Defendant 7-1) for 2014(wa)25200 Case of Claiming Damages in Japan, with English machine translation.
Notice of Reasons for Refusal drafted on Jan. 18, 2012 for Japanese Patent Application No. 2011-226907, which is Evidence Otsu 7-2 (Evidence submitted by the Defendant 7-2) for 2014(wa)25200 Case of Claiming Damages in Japan, with English machine translation, already submitted as IDS on Aug. 12, 2019.
Written Statement submitted on Apr. 20, 2012 for Japanese Patent Application No. 2012-067089, which is Evidence Otsu 8 (Evidence submitted by the Defendant 8) for 2014(wa)25200 Case of Claiming Damages in Japan, with English machine translation.
Written Opinion submitted on Oct. 9, 2012 for Japanese Patent Application No. 2011-226908, which is Evidence Otsu 9-2 (Evidence submitted by the Defendant 9-2) for 2014(wa)25200 Case of Claiming Damages in Japan, with English machine translation.
Written Statement submitted on Nov. 11, 2011 for Japanese Patent Application No. 2011-226908, which is Evidence Otsu 9-3 (Evidence submitted by the Defendant 9-3) for 2014(wa)25200 Case of Claiming Damages in Japan, with English machine translation.
Written Amendment submitted on Mar. 10, 2008 for Japanese Patent Application No. 2004-259280, which is Evidence Otsu 10-1 (Evidence submitted by the Defendant 10-1) for 2014(wa)25200 Case of Claiming Damages in Japan, with English machine translation.
Notice of Reasons for Refusal drafted on Jul. 29, 2008 for Japanese Patent Application No. 2004-259280, which is Evidence Otsu 10-2 (Evidence submitted by the Defendant 10-2) for 2014(wa)25200 Case of Claiming Damages in Japan, with English machine translation.
Written Amendment submitted on Oct. 3, 2008 for Japanese Patent Application No. 2004-259280, which is Evidence Otsu 10-3 (Evidence submitted by the Defendant 10-3) for 2014(wa)25200 Case of Claiming Damages in Japan, with English machine translation.
Written Opinion submitted on Oct. 3, 2008 for Japanese Patent Application No. 2004-259280, which is Evidence Otsu 10-4 (Evidence submitted by the Defendant 10-4) for 2014(wa)25200 Case of Claiming Damages in Japan, with English machine translation.
Djyaprawira, D.D. et al., "230% Room-Temperature Magnetoresistance in CoFeB/MgO/CoFeB Magnetic Tunnel Junctions", Appl. Phys. Lett, vol. 86, (2005), p. 092502-1-092502-3, which is Evidence Otsu 12 (Evidence submitted by the Defendant 12) for 2014(wa)25200 Case of Claiming Damages in Japan, and which is also called as "Djyaprawira article", already submitted as IDS on Aug. 12, 2019.
"Part I Chapter 1" at "Examination Guidelines for Patent and Utility Model in Japan" of Jul. 2013, which is Evidence Otsu 13 (Evidence submitted by the Defendant 13) for 2014(wa)25200 Case of Claiming Damages in Japan, with English translation.
Yuasa, S. et al., "Creating non-volatile electronics by spintronics technology", Synthesiology, vol. 2, No. 3, (2009), p. 211-222, which is Evidence Otsu 22 (Evidence submitted by the Defendant 22) for 2014(wa)25200 Case of Claiming Damages in Japan, with English translation.
"IT Appliances with Zero Standby Power: Is the Dream Close to Reality?", AIST Stories, No. 1, (2013), pp. 4-9, which is Evidence Otsu 26 (Evidence submitted by the Defendant 26) for 2014(wa)25200 Case of Claiming Damages in Japan, with English translation.
International Search Report of PCT/JP2005/004720 dated Jun. 21, 2005.
Wolf, S.A. et al., "Spintronics: A Spin-Based Electronics Vision for the Future", Science, vol. 294, Nov. 16, 2001, pp. 1488-1495.
Wulfhekel, W. et al., "Single-Crystal Magnetotunnel Junctions", Applied Physics Letters, vol. 78, No. 4, Jan. 22, 2001, pp. 509-511.

(56) References Cited

OTHER PUBLICATIONS

Julliere, M., "Tunneling Between Ferromagnetic Films", Physics Letters, vol. 54A, No. 3, Sep. 1975, pp. 225-226.
Soulen, R.J.., Jr. et al., "Measuring the Spin Polarization of a Metal with a Superconducting Point Contact", Science, vol. 282, Oct. 2, 1998, pp. 85-88.
Saito, Y. et al., "Correlation between Barrier Width, Barrier Height, and DC Bias Voltage Dependences on the Magnetoresistance Ratio in Ir—Mn Exchange Biased Single and Double Tunnel Junctions", Jpn. J. Appl. Phys., vol. 39 (2000), pp. L1035-L1-38.
Iura, S, et al., "Enhancement of Thermal Stability in Ferromagnetic Tunnel Junctions Prepared by the Radical Oxidation Method", Journal of the Magnetics Society of Japan, vol. 26, No. 6 (2002), pp. 839-842, abstract only in English.
Bowen, M. et al., "Large Magnetoresistance in Fe/MgO/FeCo(001) Epitaxial Tunnel Junctions on GaAs(001)", Applied Physics Letters, vol. 79, No. 11, Sep. 10, 2001, pp. 1655-1657.
Simmons, John G., "Generalized Formula for the Electric Tunnel Effect between Similar Electrodes Separated by a Thin Insulating Film", Journal of Applied Physics, vol. 34, No. 6, Jun. 1963, pp. 1793-1803.
Vassent, J.L. et al., "A Study of Growth and the Relaxation of Elastic Strain in MgO on Fe(001)", J. Appl. Phys. vol. 80, No. 10, Nov. 15, 1996, pp. 5727-5735.
Faure-Vincent, J. et al., "High Tunnel Magnetoresistance in Expitaxial Fe/MgO/Fe Tunnel Junctions", Applied Physics Letters, vol. 82, No. 25, Jun. 23, 2003, pp. 4507-4509.
Meyerheim, H.L. et al., "Geometrical and Compositional Structure at Metal-Oxide Interfaces: MgO on Fe(001)", Physical Review Letters, vol. 87, No. 7, Aug. 13, 2001, p. 076102-1-076102-4.
Matron, J. et al., "Theory of Tunneling Magnetoresistance of an Epitaxial Fe/MgO/Fe(001) Junction", Physical Review B., vol. 63, 220403(R), 2001, p. 220403-1-220403-4.
Zhang, X.-G. et al., "Effects of the Iron-Oxide Layer in Fe—FeO—MgO—Fe Tunneling Junctions", Physical Review B, vol. 68, 092402, 2003, pp. 092402-1-092402-4.
Zhang, X.-G. et al., "Large Magnetoresistance in bcc Co/MgO/Co and FeCo/MgO/FeCo Tunnel Junctions", Physical Review B., vol. 70, 172407, 2004, p. 172407-1-172407-4.
Gibson, A. et al., "Stability of Vacancy Defects in MgO: The Role of Charge Neutrality", Physical Review B., vol. 50, No. 4, Jul. 15, 1994-II, pp. 2582-2592.
Yuasa, S. et al., "High Tunnel Magnetoresistance at Room Temperature in Fully Expitaxial Fe/MgO/Fe Tunnel Junctions Due to Coherent Spin-Polarized Tunneling", Japanese Journal of Applied Physics, vol. 43, No. 4B, 2004, pp. L588-L590.
Mitani, S., et al., "Fe/MgO/FeCo (100) Epitaxial Magnetic Tunnel Junctions Prepared by Using in situ Plasma Oxidation", Journal of Applied Physics, vol. 93, No. 10, Parts 2 and 3, May 15, 2003, p. 8041 8043.
Popova, E., et al., "Epitaxial MgO Layer for Low-Resistance and Coupling-Free Magnetic Tunnel Junctions", Applied Physics Letters, vol. 81, No. 6, Aug. 5, 2002, pp. 1035-1037.
Boubeta, C. Martinez, et al., "Magnetic Coupling in Epitaxial TM/MgO/Fe(001) (TM=FeCo, Fe/Co, Fe) Macroscopic and MicroscopicTrilayers", Journal of Applied Physics, Vo. 94, No. 6, Sep. 15, 2003, pp. 4006-4012.
Supplementary European Search Report from European Patent Office for Application No. 05720955.3 2222, Patent No. 1737055, PCT/JP2005004720 dated Jul. 2, 2008.
Office Action from European Patent Office dated Nov. 6, 2009
F. Ernult et al., "Preparation of Nanometer-Scale Iron Dots on Insulating Layer", Science and Technology of Advanced Materials, vol. 4, (2003), pp. 383-389.
David J. Smith et al., "Structural Characterization of Thin Film Ferromagnetic Tunnel Junctions", Journal of Applied Physics, vol. 83, No. 10, May 15, 1998, pp. 5154-5158.
X. W. Li et al., "Fabrication and Properties of Heteroepitaxial Magnetite (Fe304) Tunnel Junctions", Applied Physics Letters, vol. 73, No. 22, Nov. 30, 1998, pp. 3282-3284.

C. L. Platt, et al., "Spin Polarized Tunneling in Reactively Sputtered Tunnel Junctions", Journal of Applied Physics, vol. 81, No. 8, Apr. 15, 1997, pp. 5523-5525.
P. Turban et al., "Growth and Characterization of Single Crystalline NiMnSb Thin Films and Epitaxial NiMnSb/MgO/NiMnSb(001) Trilayers", 2002 The American Physical Society, Physical Review B., vol. 65, p. 134417-1 to 134417-13.
T. Moriyama et al., "Preparation and Magnetoresistance in Single-Crystal and Polycrystal Fe/MgO/FeCo Tunnel Junctions", The Physical Society of Japan, 2003 Spring meeting, Abstracts Book 58(1-3), 460, (Mar. 6, 2003).
Moodera et al., Ferromagnetic-lnsulator-FerromagneticTunneling: Spin-Dependent Tunneling and Large Magnetoresistance in Trilayer Junctions KInvited), Journal of Physics DF, vol. 79, No. 8, Apr. 15, 1996, pp. 4724-4729.
Masayoshi Tonouchi et al., "Epitaxial Growth of NbN on an Ultrathin MgO/Semiconductor System", Journal of Applied Physics, vol. 62, No. 3, Aug. 1, 1987, pp. 961-966.
"Giant tunnel magnetoresistance in magnetic tunnel junctions with a crystalline $M_gO(001)$ barrier," S. Yuasa and D.D. Djayaprawira, Journal of Physics D Applied Physics, 1 Phys, D: Appl. Phys. 40 (2007) R337-R354.
Office Action issued from Japanese Patent Office, in corresponding Japanese Patent Application No. 2011-226907, dated Jan. 31, 2012, pp. 1-3.
Araki et al., "Fabrication and Electric Properties of Lapped Type of TMR Heads for ~ 50 $GB/In^2$ and Beyond," IEEE Transactions on Magnetics, vol. 38, No. 1, pp. 72-77, Jan. 2002.
David D. Djayaprawira et al., "Novel Sputtering Technology of Magnetic Tunnel Junctions for MRAM Application," Papers 01 the $66^{th}$ Symposium on Semiconductors and Integrated Circuits Technology, vol. 66, pp. 58-61, 2004.
H. Domon et al., "Effect of Ge Addition on Postannealed CoCrGePt Thin Film Media," Journal of Applied Physics, vol. 91, No. 10, pp. 8632-8634, May 15, 2002.
H. Domon et al. "Reduction of Magnetic Interaction in CoB/Pd Multilayer Perpendicular Media Using a Phase-Separated Pd—SiO Underlayer," Journal of Applied Physics, vol. 93, No. 10, pp. 8164-8166, May 15, 2003.
Extended European Search Report, issued from European Patent Office, of European Application No. 08159511.8, dated Jun. 5, 2009.
T. Kakuta et al., "Novel PVD Tool for Magnetoresistive Random Access Memory (MRAM) Mass Production," Anelva Technical Report, vol. 10, pp. 27-33, Jan. 25, 2004.
A. Kobayashi et al., "TMR Devices Fabricated with RIE Etching Using Co+ $NH_3$," Journal of the Magnetics Society of Japan, vol. 28, No. 2, Feb. 1, 2004.
J.S. Moodera et al., "Large Magnetoresistance at Room Temperature in Ferromagnetic Thin Film Tunnel Junctions," Physical Review Letters, vol. 74, No. 16, pp. 3273-3276, Apr. 17, 1995.
J.S. Moodera, "Interface Magnetism and Spin Wave Scattering in Ferromagnet-lnsulator-FerromagnetTunnel Junctions," Physical Review Letters, vol. 80, No. 13, pp. 2941-2944, Mar. 30, 1998.
J. Murai et al., "Direct Observation of Magnon Excitation in a Ferromagnetic Tunnel Junction Using Inelastic-Electron-Tunneling Spectroscopy," Japanese Journal of Applied Physics, vol. 38, pp. L1106-L1108, Oct. 1, 1999.
K. Nagasaka et al., "CPP Operational Mode of GMR Head," Fujitsu Sci. Tech. J., vol. 37, No. 2, pp. 192-200, Dec. 2001.
T. Osada et al., "Dry Etching of Magnetic Thin Film Stacks Using $CO/NH_3$ and $CH_3OH$ Gases for Tunneling Magneto-Resistance Devices," 2004 Dry Process International Symposium, vol. 4, pp. 127-131, 2004.
Stuart S.P. Parkin et al. "Giant Tunnelling Magnetoresistance At Room Temperature with MgO (100) Tunnel Barriers," Nature Materials, vol. 3, pp. 862-867, Dec. 2004.
M. Takagishi et al., "The Applicability of CPP-GMR Heads for Magnetic Recording," IEEE Transactions on Magnetics, vol. 38, No. 5, pp. 2277-2282, Sep. 2002.
A. Tanaka et al., "Spin-Valve Heads in the Current-Perpendicular-to-Plane Mode for Ultrahigh-Density Recording," IEEE Transactions on Magnetics, vol. 38, No. 1, Jan. 2002.

(56) References Cited

OTHER PUBLICATIONS

K. Tsunekawa et al., "Surface Treatment Techniques in Fabrication of GMR and TMR Films, " Journal of the Magnetics Society of Japan, vol. 28, No. 11, pp. 1074-1080, Nov. 1, 2004.

D. Wang et al., "70% TMR at Room Temperature for SDT Sandwich Junctions With CoFeB as Free and Reference Layers," IEEE Transactions on Magnetics, vol. 40, No. 4, pp. 2270-2271, Jul. 4, 2004.

S. Yoshimura et al., "Magnetic Grain Size Reduction by Using Oxygen Exposure Process Onto Very Thin Islandlike WCr Seedlayer in Longitudinal Recording Media," Journal of Applied Physics, vol. 91, No. 10, pp. 8629-8631, May 15, 2002.

S. Yoshimura et al. Grain Size Reduction by Utilizing A Very Thin, High-Melting-Point WCr Seedlayer in Longitudinal Media: Media Noise Reduction in High $H_k^{grain}$ Media, vol. 25, No. 4-2, pp. 627-630 (2001).

Yu et al., "Electron Transport Properties in Magnetic Tunnel Junctions with Epitaxial NiFe (111) Ferromagnetic Bottom Electrodes," Applied Physics Letters, vol. 82, No. 26, pp. 4735-4737, Jun. 30, 2003.

S. Yuasa et al. "Magnetic Tunnel Junctions With Single-Crystal Electrodes: A Crystal Anisotropy of Tunnel Magneto-Resistance," Europhysics Letters, vol. 52, No. 3, pp. 344-350 Nov. 1, 2000.

S. Yuasa et al., "Giant Room-Temperature Magnetoresistance in Single-Crystal Fe/MgO/Fe Magnetic Tunnel Junctions," Nature Materials vol. 3, pp. 868-871, Oct. 31, 2004.

S. Yuasa et al., "Spin-Polarized Resonant Tunneling In Magnetic Tunnel Junctions," Science, vol. 297, pp. 234-237, Jul. 12, 2002.

S. Zhang et al. "Quenching of Magnetoresistance by Hot Electrons in Magnetic Tunnel Junctions," Physical Review Letters, vol. 79, No. 19, pp. 3744-3747, Nov. 10, 1997.

Shang, et al. "The First-principles Study of Electronic Structure of Fe/MgO/Fe Magnetic Tunnel Junctions Interface", 2005, pp. 2255-2258, vols. 475-479, Materials Science Forum.

Meyerheim, et al. "Surface X-Ray Diffraction Analysis of the MGO/FE(001) Interface: Evidence for an FEO Layer", 2002, p. 144433-1-144433-7, vol. 65, Physical Review B.

Djayaprawira, et al., "230% Room-Temperature Magnetoresistance in COFEB/MGO/COFEB Magnetic Tunnel Junctions" 2005, p. 092502-1-092502-3, vol. 86, Appl. Phys. Lett.

Miyokawa, et al., "X-Ray Absorption and X-Ray Magnetic Circular Dichroism Studies of a Monatomic FE(001) Layer Facing a Single-Crystalline", 2005, pp. L9-L11, vol. 44, No. 1, Japanese Journal of Applied Physics.

Klaua, et al., "Growth. Structure, Electronic, and Magnetic Properties of MGO/FE(001) Bilayers and FE/MGO/FE(001) Trilayers" 2001, vol. 64, p. 134411-1-134411-8, Physical Review B.

Nozaki, et al, "Bias Voltage Effect on Tunnel Magnetoresistance in Fully Epitaxial MGO Double-Barrier Magnetic Tunnel Junctions" 2005, p. 082501-1-082501-3, vol. 86, Appl. Phys. Lett.

Butler, et al. "Spin-Dependent Tunneling and Conductance of FE/MGO/FE Sandwiches", 2001, p. 054416-1-054416-11, vol. 63, Physical Review.

Zhang, et al., "Large Magnetoresistance in BCC. CO/MGO/CO and FECO/MGO/FECO Tunneling Junctions", Nov. 17, 2012, pp. 1-9.

Boubeta, et al. "Magnetization Reversal and Magnetic Anisotropies in Epitaxial FE/MGO and Fe/MgO/Fe heterostructures grown on Si(001)", Feb. 15, 2003, pp. 2126-2134, vol. 93, No. 4, J. Appl. Phys.

\* cited by examiner

MASS SPECTRA

OXYGEN PARTIAL PRESSURE DURING MgO EVAPORATION

*Prior Art*

FIG. 9 (A) *Prior Art*
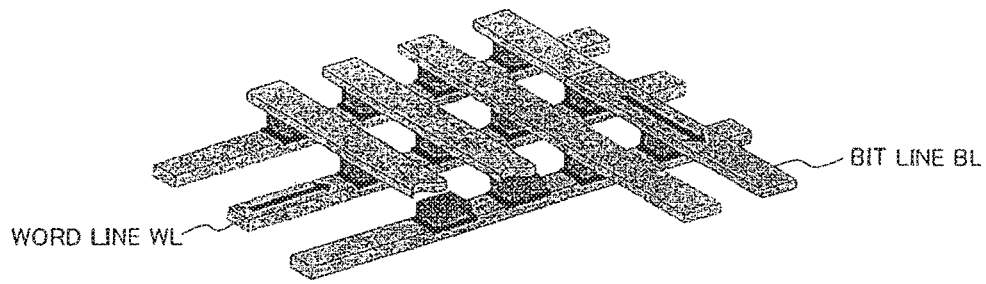
FIG. 9 (B) *Prior Art*
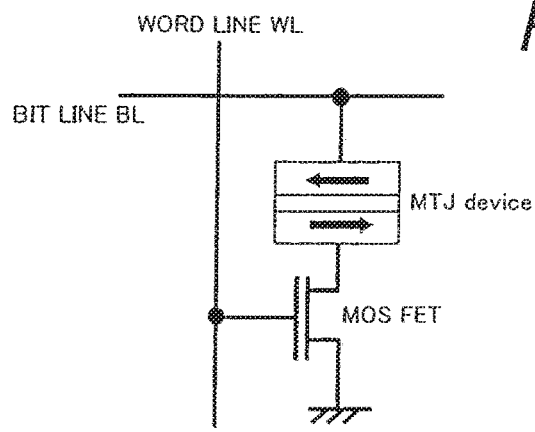
FIG. 9 (C) *Prior Art*
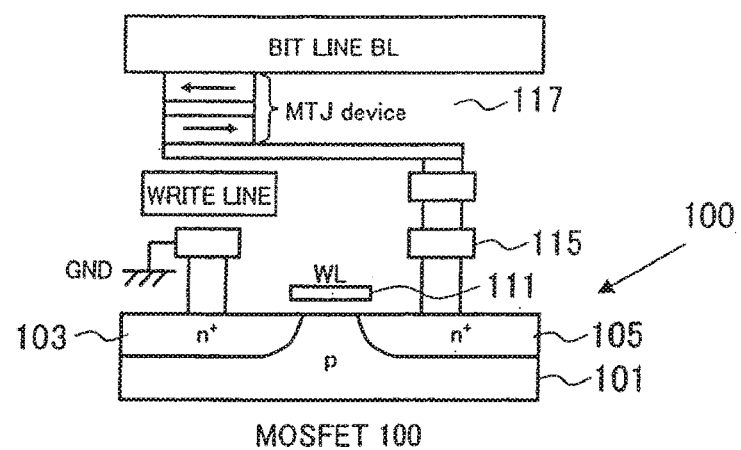

METHOD OF MANUFACTURING A MAGNETORESTIVE RANDOM ACCESS MEMEORY (MRAM)

CROSS-REFERENCE TO RELATED APPLICATIONS

The present application is a continuation of U.S. application Ser. No. 16/443,875, filed Jun. 18, 2019, which is a continuation of U.S. application Ser. No. 15/428,842, filed Feb. 9, 2017 (now U.S. Pat. No. 10,367,138), which is a continuation of U.S. application Ser. No. 14/837,558, filed Aug. 27, 2015 (now U.S. Pat. No. 9,608,198), which is a continuation of U.S. application Ser. No. 13/767,290, filed Feb. 14, 2013 (now U.S. Pat. No. 9,123,463), which is a continuation of U.S. application Ser. No. 13/400,340, filed Feb. 20, 2012 (now U.S. Pat. No. 8,405,134), which is a continuation of U.S. application Ser. No. 12/923,643, filed Sep. 30, 2010 (now U.S. Pat. No. 8,319,263), which is a continuation of U.S. application Ser. No. 10/591,947, filed Sep. 8, 2006 (now U.S. Pat. No. 7,884,403), which is a National Stage Application of PCT/JP2005/004720, filed Mar. 10, 2005, which claims priority from Japanese Application Nos. 2004-071186 and 2004-313350, filed Mar. 12, 2004 and Oct. 28, 2004, respectively, the content of each is hereby incorporated by reference into this application.

BACKGROUND OF THE INVENTION

Field of the Invention

The present invention relates to a magnetic tunnel junction device and a method of manufacturing the same, particularly to a magnetic tunnel junction device with a high magnetoresistance and a method of manufacturing the same.

Description of Related Art

Magnetoresistive random access memories (MRAMs) refer to a large-scale integrated memory circuit that is expected to replace the currently widely used DRAM memories. Research and development of MRAM devices, which are fast and non-volatile memory devices, are being extensively carried out, and sample products of a 4 Mbit MRAM have actually been delivered.

FIGS. 8(A) and 8(B) show the structure and operation principle of a magnetic tunnel junction device (to be hereafter referred to as a "MTJ device"), which is the most important part of the MRAM. As shown in FIG. 8(A), a MTJ device comprises a tunnelling junction structure in which a tunnel barrier (to be hereafter also referred to as a "barrier layer") made of an oxide is sandwiched between a first and a second electrode made of a ferromagnetic metal. The tunnel barrier layer comprises an amorphous Al—O layer (see Non-Patent Document 1). As shown in FIG. 8(A), in the case of parallel magnetization alignment where the directions of magnetizations of the first and second ferromagnetic electrodes are aligned parallel, the electric resistance of the device with respect to the direction normal to the interfaces of the tunneling junction structure decreases. On the other hand, in the case of antiparallel magnetization alignment where the directions of magnetizations of the first and second ferromagnetic electrodes are aligned antiparallel as shown in FIG. 8(B), the electric resistance with respect to the direction normal to the interfaces of the tunneling junction structure increases. The resistance value does not change in a general state, so that information "1" or "0" can be stored depending on whether the resistance value is high or not. Since the parallel and antiparallel magnetization alignments can be stored in a non-volatile fashion, the device can be used as a non-volatile memory device.

FIGS. 9(A)-(C) show an example of the basic structure of the MRAM. FIG. 9(A) shows a perspective view of the MRAM, and FIG. 9(B) schematically shows a circuit block diagram. FIG. 9(C) is a cross-section of an example of the structure of the MRAM. Referring to FIG. 9(A), in an MRAM, a word line WL and a bit line BL are disposed in an intersecting manner, with an MRAM cell disposed at each intersection. As shown in FIG. 9(B), the MRAM cell disposed at the intersection of a word line and a bit line comprises a MTJ device and a MOSFET directly connected to the MTJ device. Stored information can be read by reading the resistance value of the MTJ device that functions as a load resistance, using the MOSFET. The stored information can be rewritten by applying a magnetic field to the MTJ device, for example. As shown in FIG. 9(C), an MRAM memory cell comprises a MOSFET 100 including a source region 105 and a drain region 103 both formed inside a p-type Si substrate 101, and a gate electrode 111 formed on a channel region that is defined between the source and drain regions. The MRAM also comprises a MTJ device 117. The source region 105 is grounded, and the drain is connected to a bit line BL via the MTJ device. A word line WL is connected to the gate electrode 111 in a region that is not shown.

Thus, a single non-volatile MRAM memory cell can be formed by a single MOSFET 100 and a single MTJ device 117. The MRAMs are therefore suitable where high levels of integration are required.

Non-Patent Document 1: D. Wang, et al.: Science 294 (2001) 1488.

SUMMARY OF THE INVENTION

Although there are prospects for achieving MRAMs with capacities on the order of 64 Mbits based on the current technologies, the characteristics of the MTJ device, which is the heart of MRAM, needs to be improved if higher levels of integration are to be achieved. In particular, in order to increase the output voltage of the MTJ device, the magnetoresistance must be increased and the bias voltage characteristics must be improved. FIG. 10 illustrates how the magnetoresistance in a conventional MTJ device using an amorphous Al—O as the tunnel barrier changes as a function of the bias voltage (L1). As shown, in the conventional MTJ device, the magnetoresistance is small and, notably, it tends to drastically decrease upon application of bias voltage. With such characteristics, the output voltage when operation margins are taken into consideration is too small for the device to be employed for an actual memory device. Specifically, the magnetoresistance of the current MTJ device is small at approximately 70%, and the output voltage is also small at no more than 200 mV, which is substantially half the output voltage of a DRAM. This has resulted in the problem that as the level of integration increases, signals are increasingly lost in noise and cannot be read.

It is an object of the invention to increase the output voltage of a MTJ device. It is another object of the invention to provide a memory device with a high magnetoresistance for stable operation.

In one aspect, the invention provides a magnetoresistive device comprising a magnetic tunnel junction structure comprising: a tunnel barrier layer; a first ferromagnetic material layer of the BCC structure formed on a first side of the tunnel barrier layer; and a second ferromagnetic material layer of the BCC structure formed on a second side of the tunnel barrier layer, wherein the tunnel barrier layer is formed by a single-crystal $MgO_x$ (001) layer or a poly-crystalline $MgO_x$ (0<x<1) layer in which the (001) crystal plane is preferentially oriented.

The invention further provides a magnetoresistive device comprising a magnetic tunnel junction structure comprising: a tunnel barrier layer comprising MgO(001); a first ferromagnetic material layer comprising Fe(001) formed on a first side of the tunnel barrier layer; and a second ferromagnetic material layer comprising Fe(001) formed on a second side of the tunnel barrier layer, wherein the MgO layer is formed by a single-crystalline $MgO_x$ (001) layer or a poly-crystalline $MgO_x$ (0<x<1) layer in which the (001) crystal plane is preferentially oriented. In a preferred embodiment, the band discontinuity value (the height of the tunnel barrier) between the bottom of the conduction band of the MgO(001) layer and the Fermi energy of the Fe(001) layer is smaller than an ideal value of a perfect single-crystal without defect. These features increase the magnetoresistance and thereby allow the output voltage of the MTJ device to be increased. By using any of the aforementioned MTJ devices as a load for a single transistor, a non-volatile memory can be formed.

In another aspect, the invention provides a method of manufacturing a magnetoresistive device comprising: preparing a substrate; depositing a first Fe(001) layer on the substrate; depositing a tunnel barrier layer on the first Fe(001) layer by electron beam evaporation under high vacuum, the tunnel barrier layer comprising a single-crystalline $MgO_x$ (001) or a poly-crystalline $MgO_x$ (0<x<1) in which the (001) crystal plane is preferentially oriented; and forming a second Fe(001) layer on the tunnel barrier layer.

The invention furthermore provides a method of manufacturing a MTJ device comprising a first step of preparing a substrate comprising a single-crystalline $MgO_x$ (001) or a poly-crystalline $MgO_x$ (0<x<1) in which the (001) crystal plane is preferentially oriented, a second step of depositing a first Fe(001) layer on the substrate and performing an annealing process to make the surface flat, a third step of depositing a tunnel barrier layer on the first Fe(001) layer by electron beam evaporation, the tunnel barrier layer comprising a single-crystalline $MgO_x$ (001) or a poly-crystalline $MgO_x$ (0<x<1) in which the (001) crystal plane is preferentially oriented, and a fourth step of forming a second Fe(001) layer on the tunnel barrier layer. The method may further comprise the step of growing a seed layer between the first and the second steps, the seed layer comprising a single-crystalline $MgO_x$ (001) or a poly-crystalline $MgO_x$ (0<x<1) in which the (001) crystal plane is preferentially oriented. The MgO layer may be deposited using a target with the value of x in $MgO_x$ adjusted. The value of x in $MgO_x$ may be adjusted in the step of forming the MgO.

In yet another aspect, the invention provides a magnetoresistive device comprising a magnetic tunnel junction structure comprising a tunnel barrier layer comprising MgO (001), a first ferromagnetic material layer comprising an amorphous magnetic alloy formed on a first side of the tunnel barrier layer, and a second ferromagnetic material layer comprising an amorphous magnetic alloy formed on a second side of the tunnel barrier layer, wherein the discontinuous value (the height of the tunnel barrier) between the bottom of the conduction band of the MgO(001) layer and the Fermi energy of the first or the second ferromagnetic material layer comprising the amorphous magnetic alloy is lower than an ideal value of a perfect single-crystal with no defect.

BRIEF DESCRIPTION OF THE DRAWINGS

FIGS. 9(A)-(C) show an example of the basic structure of an MRAM, FIG. 9(A) showing a perspective view of the MRAM, FIG. 9(B) showing a schematic circuit diagram, and FIG. 9(C) showing a cross-sectional view of an example of its structure.

DESCRIPTION OF THE PREFERRED EMBODIMENTS

In the context of the present specification, because MgO has a cubic crystal structure (NaCl structure), the (001) plane, the (100) plane, and the (010) plane are all equivalent. The direction perpendicular to the film surface is herein considered to be the z-axis so that the film plane can be uniformly described as (001). Also in the context of the present specification, BCC structure, which the crystalline structure of ferromagnetic electrode layer, means body-centered cubic lattice structure. More specifically, BCC structure includes the BCC structure with no chemical ordering so-called A2-type structure, the BCC structure with chemical ordering such as B2-type structure and $L2_1$-type structure, and also the aforementioned structures with slight lattice distortion.

The term "ideal value" with regard to a perfect single-crystal without defect herein refers to a value that has been estimated from ultraviolet photoemission spectroscopy experiments (see W. Wulfhekel, et al.: Appl. Phys. Lett. 78 (2001) 509). The term "ideal value" is used herein because the aforementioned state can be considered to be an upper limit value of the potential barrier height of the tunnel barrier of an ideal single-crystal MgO with hardly any oxygen vacancy defect or lattice defect.

Before describing the preferred embodiments of the invention, an analysis conducted by the inventors is discussed. The magnetoresistance (MR) ratio of a MTJ device can be expressed by the following equation:

$$\Delta R/Rp=(Rap-Rp)/Rp$$

where Rp and Rap indicate the tunnel junction resistance in the cases of parallel and antiparallel magnetization alignments, respectively, of two electrodes. According to the Jullire's formula, the MR ratio at low bias voltage can be expressed by:

MR ratio=$(Rap-Rp)/Rp=2P_1P_2/(1-P_1P_2)$, and $P\alpha=(D\alpha\uparrow(E_F)-D\alpha\downarrow(E_F))/(D\alpha\uparrow(E_F)+D\alpha\downarrow(E_F))$, where α=1,2  (1)

In the above equations, Pα is the spin polarization of an electrode, and $D\alpha\uparrow(E_F)$ and $D\alpha\downarrow(E_F)$ are the density of state (DOS) at the Fermi energy ($E_F$) of the majority-spin band and the minority-spin band, respectively. Since the spin polarization of ferromagnetic transition metals and alloys is approximately 0.5 or smaller, the Jullire's formula predicts a highest estimated MR ratio of about 70%.

Although the MR ratio of approximately 70% has been obtained at room temperature when a MTJ device was made using an amorphous Al—O tunnel barrier and polycrystalline electrodes, it has been difficult to obtain the output voltage of 200 mV, which is comparable to the output voltages of DRAMs, thereby preventing the realization of MRAM as mentioned above.

Figure 1:
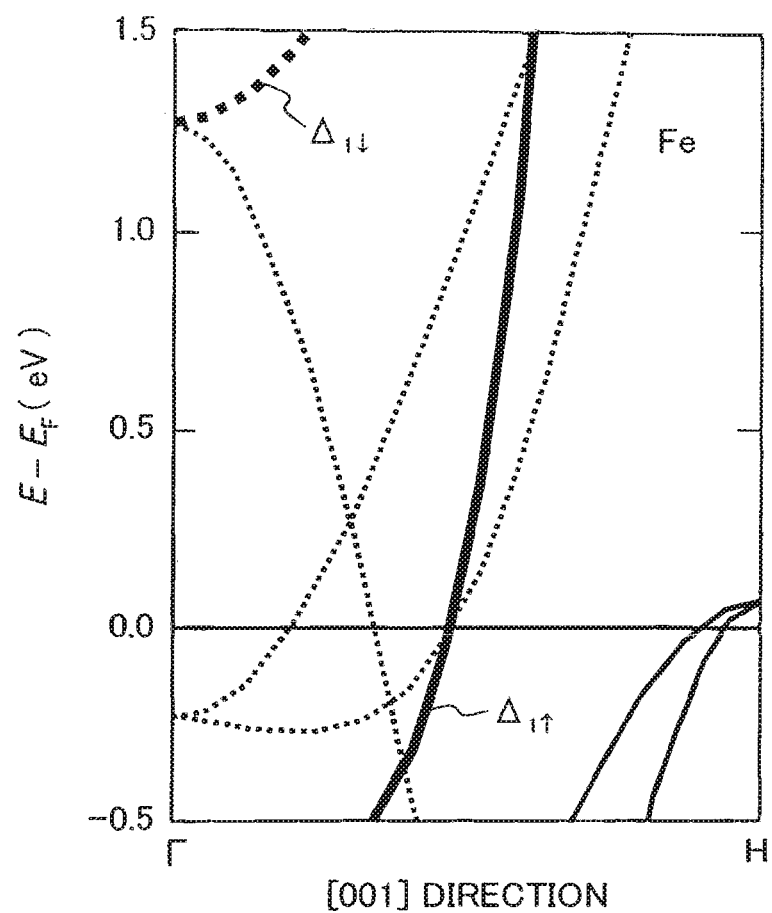
FIG. 1(B) shows the structure of a MTJ device according to a first embodiment of the invention.
FIG. 1(A) shows the energy band structure of a ferromagnetic metal Fe(001), illustrating the $E-E_F$ relationship with respect to the [001] direction of the momentum space.
Figure 1:
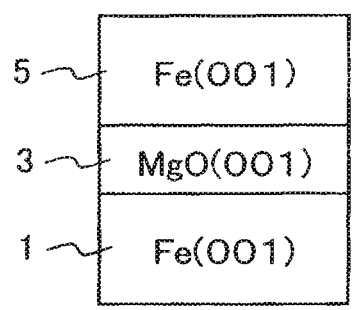

The inventors tried an approach to deposit a MTJ device in which the tunnel barrier comprises a single-crystal (001) of magnesium oxide (MgO) or a poly-crystalline MgO in which the (001) crystal plane is preferentially oriented. It is the inventors' theory that, because magnesium oxide is a crystal (where the atoms are arranged in an orderly fashion), as opposed to the conventional amorphous Al—O barrier, the electrons are not scattered and the coherent states of electrons are concerved during the tunneling process. FIG. 1(B) shows the MTJ device structure according to an embodiment of the invention. FIG. 1(A) shows the energy band structure of the ferromagnetic Fe(001), that is, the E-$E_F$ relationship with respect to the [001] direction of the momentum space. As shown in FIG. 1(B), the MTJ device structure of the present embodiment comprises a first Fe (001) layer 1, a second Fe (001) layer 5, and a single-crystalline $MgO_x$ (001) layer 3 or a poly-crystalline $MgO_x$ (0<x<1) layer 3 sandwiched therebetween, the polycrystalline layer having the (001) crystal plane preferentially oriented therein. According to the aforementioned Jullire's model, assuming that the momentum of the conduction electrons is preserved in the tunneling process, the tunneling current that passes through MgO would be dominated by those electrons with wave vector k, in the direction perpendicular to the tunnel barrier (normal to the junction interfaces). In accordance with the energy band diagram shown in FIG. 1(A) of Fe in the [001] (Γ-H) direction, the density of state (DOS) at the Fermi energy $E_F$ does not exhibit a very high spin polarization due to the fact that the sub-bands of the majority-spin and the minority-spin have states at the Fermi energy $E_F$. However, in case the coherent states of electrons are conserved in the tunneling process, only those conduction electrons that have totally symmetrical wave functions with respect to the axis perpendicular to the barrier would be coupled with the states in the barrier region and come to have a finite tunneling probability. The Δ1 band in the Fe(001) electrode has such totally symmetric wave functions. As shown in FIG. 1(A), the majority spin Δ1 band (solid line) has states at the Fermi energy $E_F$, whereas the minority spin Δ1 band (broken line) does not have state at the Fermi energy $E_F$. Because of such half-metallic characteristics of the Fe $\Delta_1$ band, there is the possibility that a very high MR ratio can be obtained in a coherent spin polarized tunneling. Since in an epitaxial (single-crystal, or (001) oriented poly-crystal) MTJ device the scattering of electrons is suppressed during the tunneling process, an epitaxial MTJ device is thought to be ideal for realizing the aforementioned coherent tunneling.

In the following, a MTJ device according to a first embodiment of the invention and a method of manufacturing the same will be described with reference to the drawings. FIGS. 2(A) to 2(D) schematically show the method of manufacturing the MTJ device having the Fe (001)/MgO (001)/Fe(001) structure according to the embodiment (to be hereafter referred to as a "Fe(001)/MgO(001)/Fe(001) MTJ device"). Fe(001) refers to a ferromagnetic material with the BCC structure. First, a single-crystal MgO(001) substrate 11 was prepared. In order to improve the morphology of the surface of the single-crystal MgO(001) substrate 11, a MgO (001) seed layer 15 was grown by the molecular beam epitaxy (MBE) method. This was subsequently followed by the growth of an epitaxial Fe(001) lower electrode (first electrode) 17 with the thickness of 50 nm on the MgO(001) seed layer 15 at room temperature, as shown in FIG. 1(B), and then annealing was performed at 350° C. under ultrahigh vacuum ($2\times10^{-8}$ Pa). Electron-beam evaporation conditions included an acceleration voltage of 8 kV, a growth rate of 0.02 nm/sec, and the growth temperature of room temperature (about 293K). The source material of the electron-beam evaporation was MgO of the stoichiometric composition (the ratio of Mg to O being 1:1), the distance between the source and the substrate was 40 cm, the base vacuum pressure was $1\times10^{-8}$ Pa, and the $O_2$ partial pressure was $1\times10^{-6}$ Pa. Alternatively, a source with oxygen vacancy defects may be used instead of the MgO of the stoichiometric composition (the ratio of Mg to O is 1:1).

Figure 3:
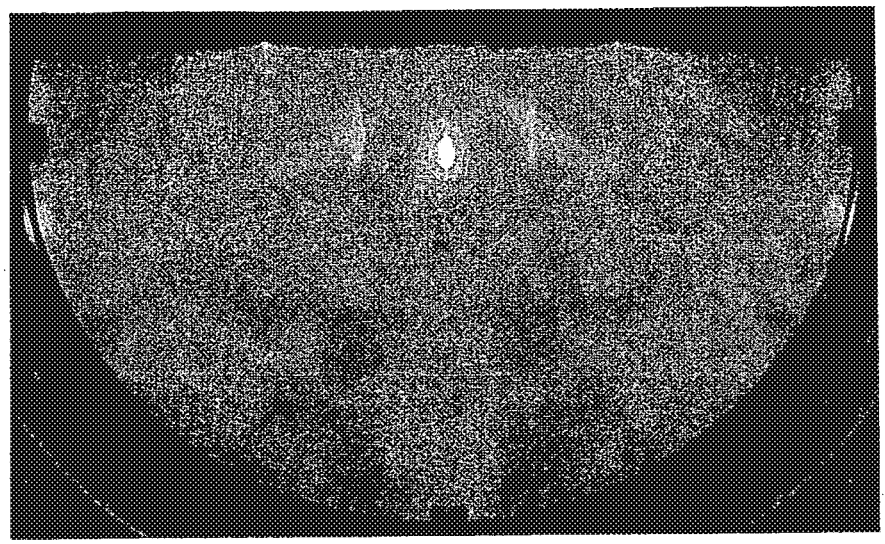
FIG. 3(A) shows a RHEED image of a Fe(001) lower electrode (a first electrode)
FIG. 3(B) shows a RHEED image of a MgO(001) barrier layer.
Figure 3:
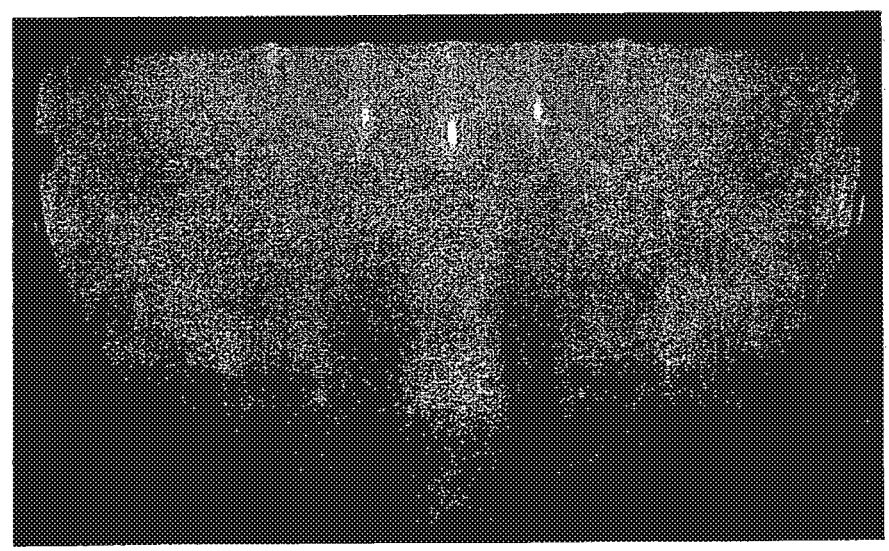

FIG. 3(A) shows a RHEED image of the Fe(001) lower electrode (a first electrode). The image shows that the Fe(001) lower electrode (first electrode) 17 possesses a good crystallinity and flatness. Thereafter, a MgO(001) barrier layer 21 with the thickness of 2 nm was epitaxially grown on the Fe(001) lower electrode (first electrode) at room temperature, also using the MgO electron-beam evaporation method. FIG. 3(B) shows a RHEED image of the MgO(001) barrier layer 21. The image shows that the MgO(001) barrier layer 21 also possesses a good crystallinity and flatness.

Figure 2:
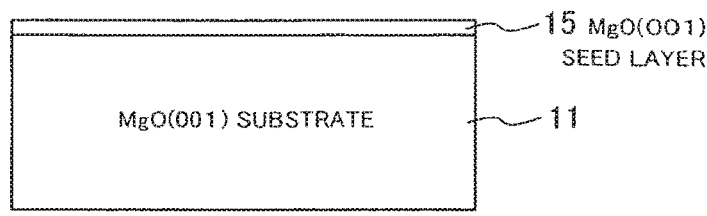
FIG. 2(A) to FIG. 2(D) schematically show the process of manufacturing a MTJ device with a Fe(001)/MgO(001)/Fe (001) structure (to be hereafter referred to as a "Fe(001)/ MgO(001)/Fe(001) MTJ device") according to an embodiment of the invention.
Figure 2:
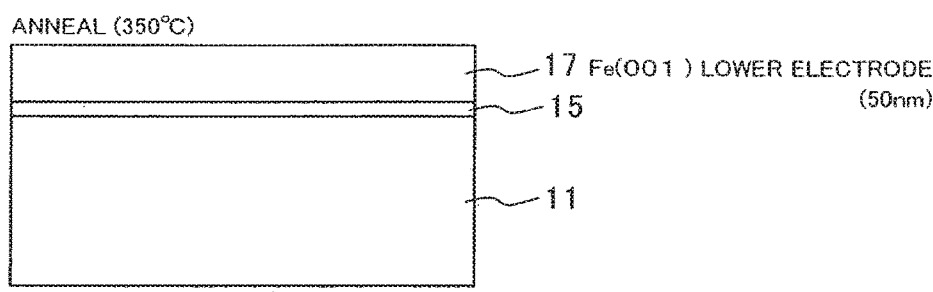
Figure 2:
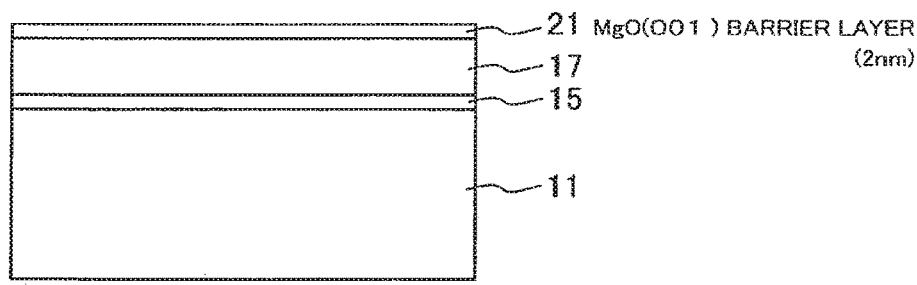
Figure 2:
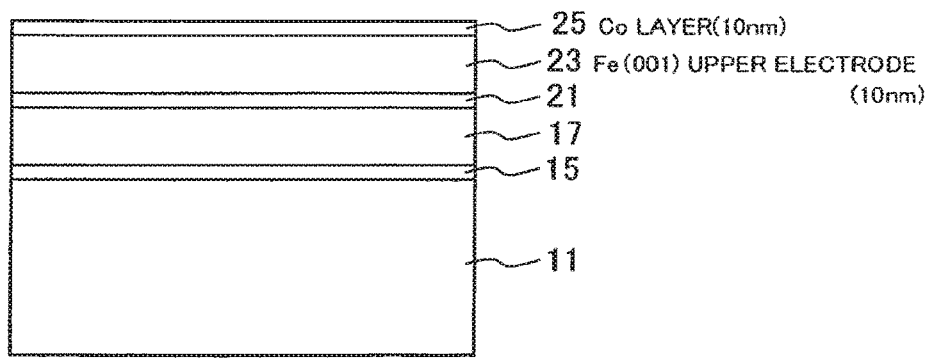

As shown in FIG. 2(D), a Fe(001) upper electrode (a second electrode) 23 with the thickness of 10 nm was formed on the MgO(001) barrier layer 21 at room temperature. This was successively followed by the deposition of a Co layer 25 with the thickness of 10 nm on the Fe(001) upper electrode (second electrode) 23. The Co layer 25 is provided to increase the coercive force of the upper electrode 23 so as to realize the antiparallel magnetization alignment. The thus prepared sample was then processed by microfabrication techniques to obtain the Fe(001)/MgO (001)/Fe(001) MTJ device.

Figure 4:
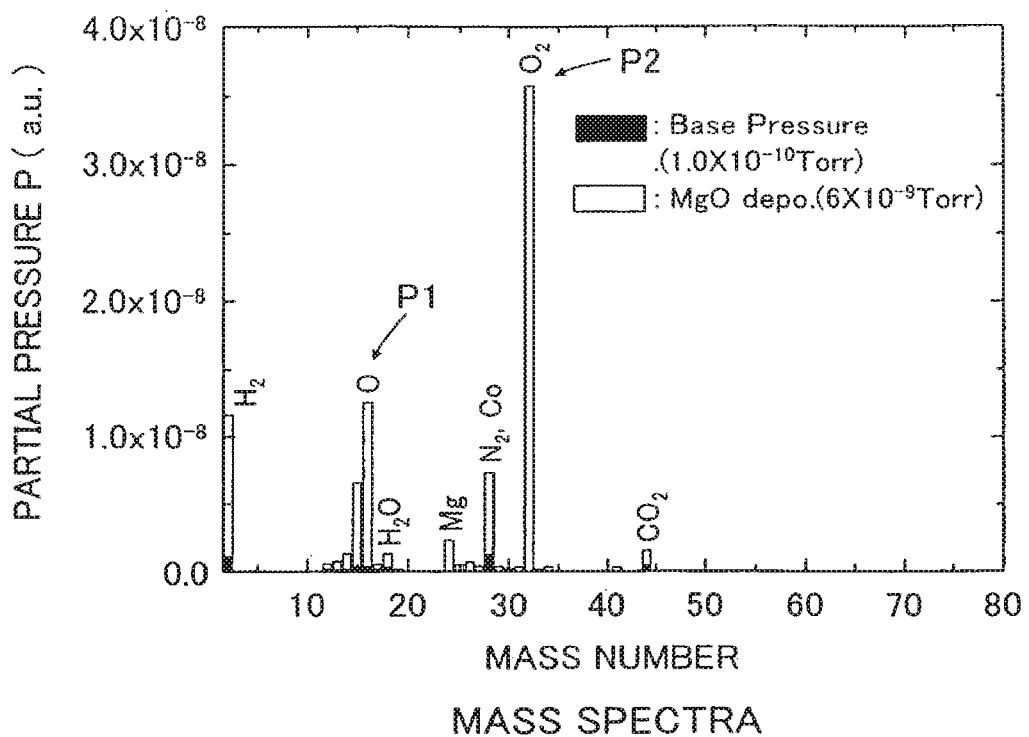
FIG. 4 shows the results of observing the quadrupole mass spectra in the deposition chamber during the MgO evaporation.
Figure 5:
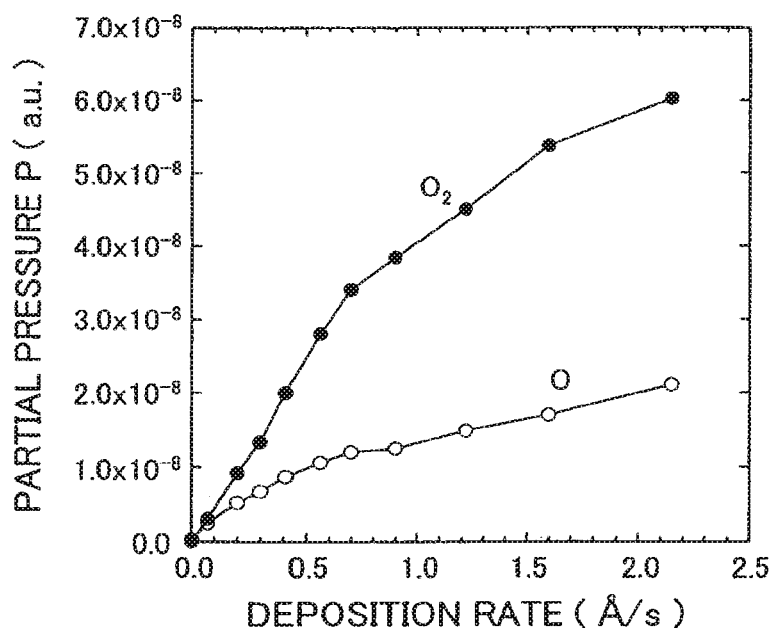
FIG. 5 shows the film deposition rate dependency of the oxygen partial pressure during the MgO evaporation.

The aforementioned MgO evaporation using an electron beam involved the formation of a film under ultrahigh vacuum of $10^{-9}$ Torr. It can be seen that in this method, the film, even when formed on a glass substrate to the thickness of 300 nm, was colorless and transparent, showing that a good crystal film was formed. FIG. 4 shows the results of observing the quadrupole mass spectra in the deposition chamber during the MgO growth. The results show that the partial pressures regarding the spectrum P1 of O and the spectrum $P_2$ of $O_2$ are high. FIG. 5 shows the film deposition rate dependency of the oxygen partial pressure during MgO evaporation. It will be seen from the figure that the oxygen partial pressure itself is high, and that the oxygen partial pressure increases as the deposition rate increases. These results indicate the separation of oxygen from MgO during the deposition of MgO. Since the separated oxygen is pumped out of the deposition chamber using vacuum pumps, there is the possibility that there are oxygen vacancy defects such as $MgO_x$ (0.9<x<1). When there are oxygen vacancy defects, the potential barrier height of the MgO tunnel barrier is thought to decrease (such as in the range of 0.10 to 0.85 eV; more specifically, 0.2 to 0.5 eV), which is thought to result in an increase in the tunneling current. In the case of a typical Al—O tunnel barrier, the height of the tunnel barrier with respect to Fe(001) electrodes is considered to be 0.7 to 2.5 eV. An ideal tunnel barrier height of a MgO crystal is 3.6 eV, and experimental values of 0.9 to 3.7 eV have been obtained. Using the method according to the present embodiment of the invention, a tunnel barrier height of approximately 0.3 eV is expected, indicating that the resistance of the tunnel barrier can be lowered. However, it should be noted that other factors, such as the influence of the aforementioned coherent tunneling, might also be involved. The value of x in $MgO_x$ due to oxygen vacancy defects is such that 0.98<x<1, and more preferably 0.99<x<1. These are the ranges such that the sole presence of Mg is excluded and the characteristics of MgO can be basically maintained.

The aforementioned tunnel barrier height φ was determined by fitting the electric conductance characteristics of the MTJ device (the relationship between tunnel current density J and bias voltage V) onto the Simmons' formula (Equation (20) in a non-patent document by J. G. Simmons: J. Appl. Phys. 34, pp. 1793-1803 (1963)) based on the WKB approximation, using the least squares method. The fitting was performed using the free electron mass (m=$9.11\times10^{-31}$ kg) as the electron's effective mass. When a bias voltage V (which is normally on the order of 500 mV to 1000 mV) is applied until non-linearity appears in the J-V characteristics, the height φ of the tunnel barrier and the effective thickness Δs of the tunnel barrier can be simultaneously determined by fitting the J-V characteristics using the Simmons' formula.

The effective thickness Δs of the tunnel barrier was determined to be smaller than the thickness of the actual MgO(001) tunnel barrier layer ($t_{MgO}$) determined from a cross-sectional transmission electron microscope image of the MTJ device by approximately 0.5 nm. This is the result of the effective thickness Δs of the tunnel barrier having been reduced from the actual MgO(001) layer thickness by the effect of the image potential produced at the interface between the MgO(001) layer and the alloy layer consisting mainly of Fe and Co.

It is noted that, in the event that $t_{MgO}$ can be accurately determined using the cross-sectional transmission electron microscope (TEM) image, the height φ of the tunnel barrier can be more simply determined by the following technique. Namely, when the bias voltage V applied to the MTJ device is small (normally 100 mV or smaller), the tunnel current density J is proportional to the bias voltage V, such that the J-V characteristics become linear. In such a low-bias voltage region, the Simmons' formula can be described as follows:

$$J=[(2m\phi)^{1/2}/\Delta s](e/h)^2\times\exp[-(4\pi\Delta s/h)\times(2m\phi)^{1/2}]\times V \quad (2)$$

where m is the mass of the free electron ($9.11\times10^{-31}$ kg), e is the elementary electric charge ($1.60\times10^{-19}$ C), and h is the Planck's constant ($6.63\times10^{-34}$ J·s). The effective thickness of the tunnel barrier Δs is approximately $t_{MgO}$—0.5 nm. By fitting the J-V characteristics of the MTJ device in the low-bias voltage region onto Equation (2), the height φ of the tunnel barrier can be simply and yet accurately estimated.

Figure 6:
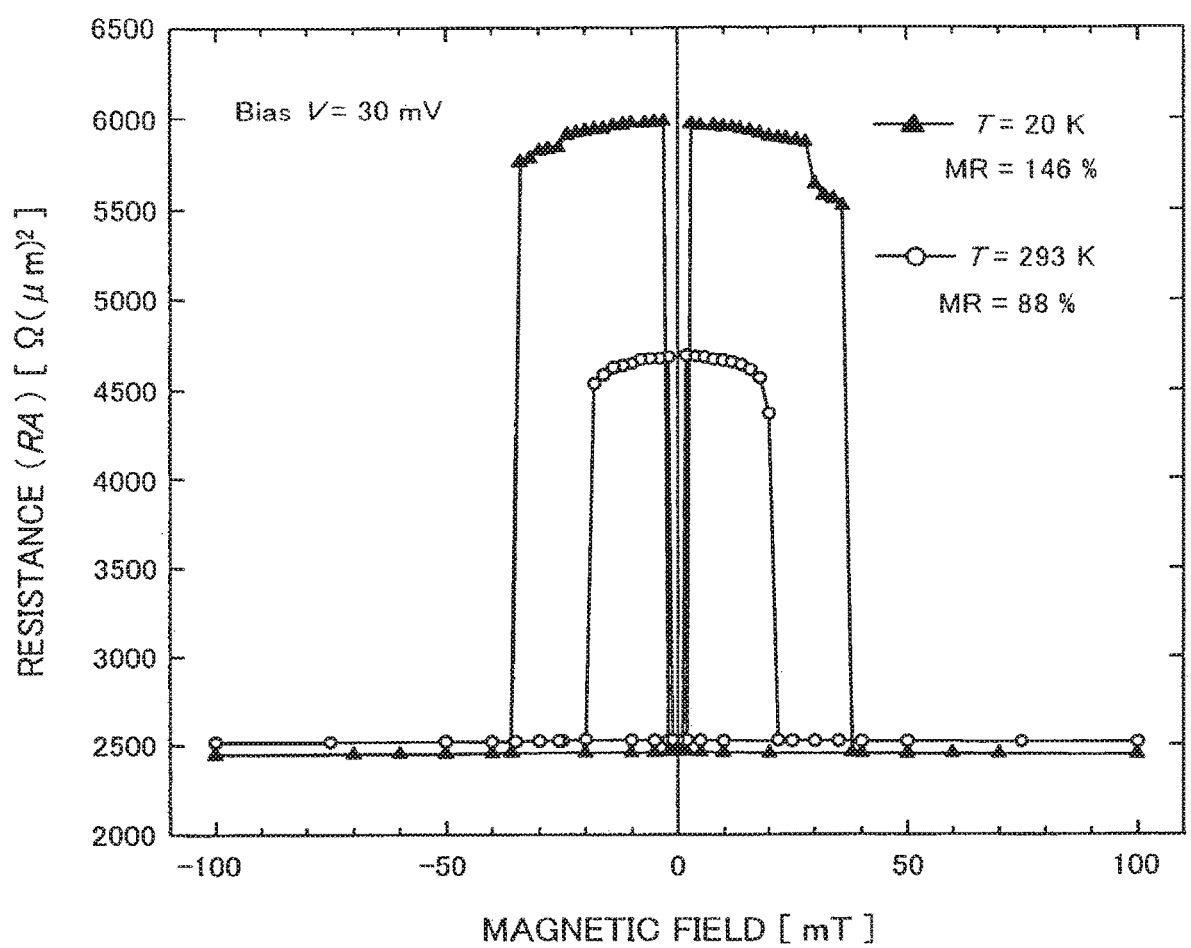
FIG. 6 shows typical magnetoresistance curves of the Fe(001)/MgO(001)/Fe(001) MTJ device.

FIG. 6 shows a typical magnetoresistance curve of the Fe(001)/MgO(001)/Fe(001) MTJ device produced by the above-described method. The MR ratio is 146% at the measurement temperature of 20K and 88% at the measurement temperature of 293K. These values represent the highest MR ratios that have so far been obtained at room temperature. Such high MR ratios cannot be explained by the spin polarization of the Fe(001) electrode and is thought rather to be related to a coherent spin-polarized tunneling. When 160 prototype MTJ devices were made, the variations regarding the MR ratio and tunneling resistance value were not more than 20%. The yield of the MTJ devices was 90% or more at the laboratory stage. These high values suggest the effectiveness of the approach of the invention. The resistance-area (RA) product of the MTJ device was on the order of a few $k\Omega\mu m^2$, which is suitable for MRAM.

Figure 7:
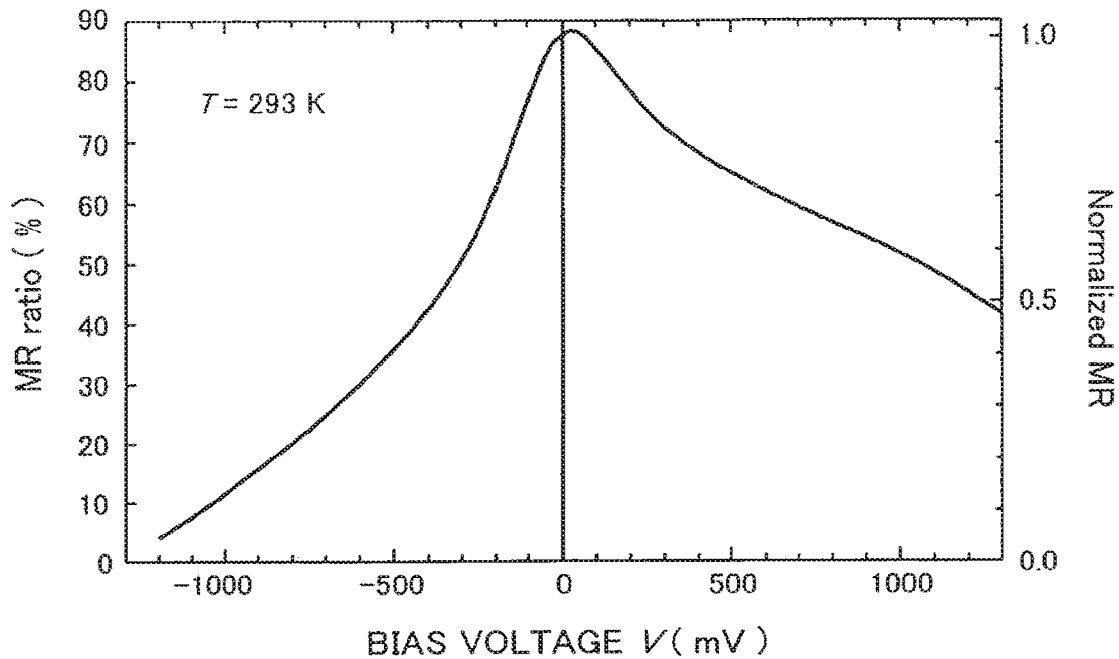
FIG. 7(A) shows the bias voltage dependency of the MR ratio at room temperature.
FIG. 7(B) shows the output voltage $V_{out}$ of the MTJ device (=bias voltage×(Rap−Rp)/ Rap).
Figure 7:
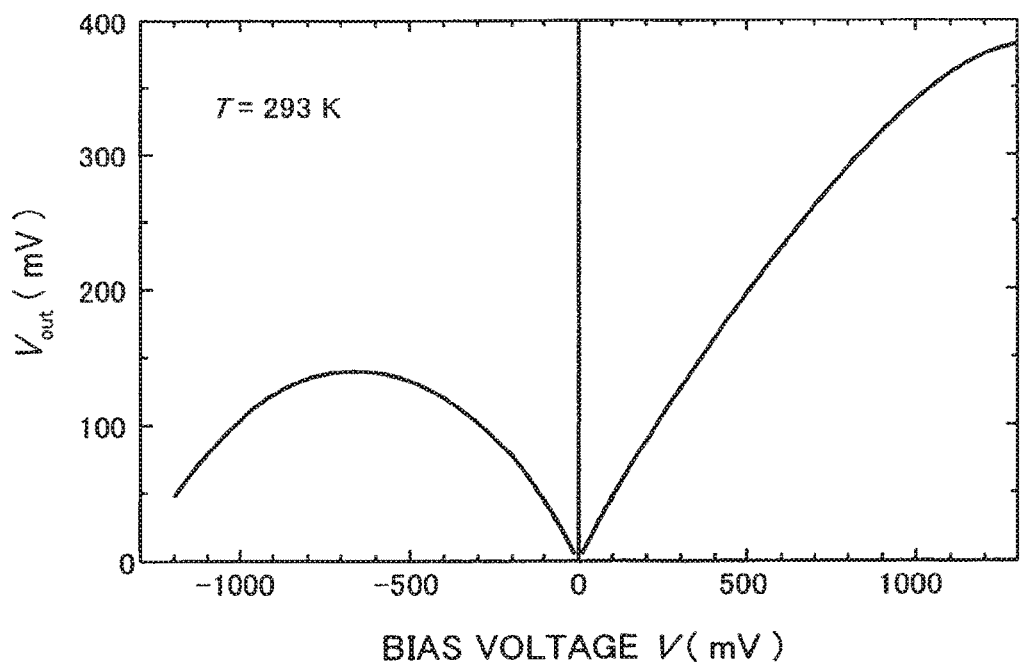
Figure 8:
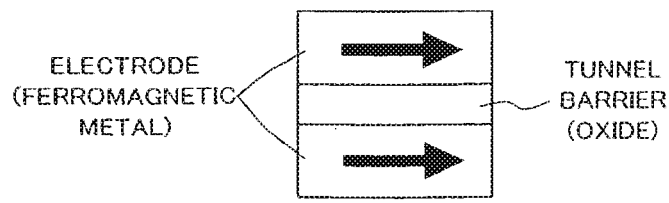
FIGS. 8(A) and 8(B) show the structure of the MTJ device and its operating principle.
Figure 8:
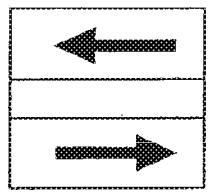
Figure 10:
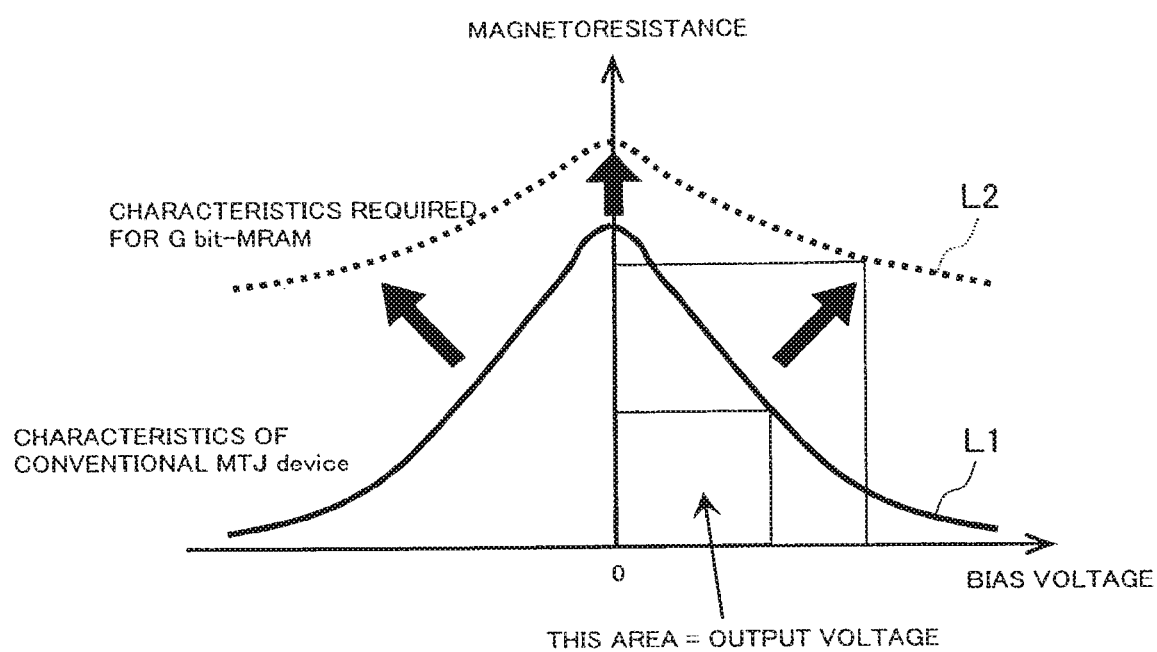
FIG. 10 shows how the magnetoresistance of a conventional MTJ device using an amorphous Al—O as the tunnel barrier changes depending on the bias voltage.

FIG. 7(a) shows the bias voltage dependency of the MR ratio at room temperature. It will be seen that the bias voltage dependency of the MR ratio is fairly small. Although the characteristics are asymmetric, the voltage $V_{half}$ at which the MR ratio is reduced in half of the zero-bias value is 1250 mV, which is a very high value. In this connection, it is noted that the voltage $V_{half}$ at which the MR ratio is reduced in half of the zero-bias value in the conventional MTJs with Al—O tunnel barrier is 300 to 600 mV. FIG. 7(b) shows the output voltage $V_{out}$ of the MTJ device (=bias voltage×(Rap−Rp)/Rap). The maximum value of the output voltage $V_{out}$ is 380 mV with a positive bias. This value is about twice as large as that (a little less than 200 mV) in the case of the Al—O barrier. These high values in terms of both MR ratio and output voltage suggest the effectiveness of the technique according to the present embodiment.

Although in the above-described embodiment Fe(001) of BCC was employed, an Fe alloy of BCC, such as an Fe—Co alloy, Fe—Ni alloy, or Fe—Pt alloy, may be used instead. Alternatively, a layer of Co or Ni with the thickness of one or several monoatomic layers may be inserted between the electrode layer and the MgO(001) layer.

Hereafter, a MTJ device according to a second embodiment of the invention and a method of manufacturing the same will be described. In the method of manufacturing a Fe(001)/MgO(001)/Fe(001) MTJ device according to the present embodiment, MgO(001) is initially deposited in a poly-crystalline or amorphous state by sputtering or the like, and then an annealing process is performed such that a poly-crystal in which the (001) crystal plane is preferentially oriented or a single-crystal is obtained. The sputtering conditions were such that, for example, the temperature was room temperature (293K), a 2-inch φ MgO was used as a target, and sputtering was conducted in an Ar atmosphere. The acceleration power was 200 W and the growth rate was 0.008 nm/s. Because MgO that is deposited under these conditions is in an amorphous state, a crystallized MgO was obtained by increasing the temperature to 300° C. from room temperature and maintaining that temperature for a certain duration of time.

Oxygen vacancy defects may be introduced by a method whereby oxygen vacancy defects is produced during growth, a method whereby oxygen vacancy defects is introduced subsequently, or a method whereby a state with oxygen vacancy defects is subjected to an oxygen plasma process or natural oxidation so as to achieve a certain oxygen deficit level.

As described above, in accordance with the MTJ device technology of the present embodiment, an annealing process is carried out for crystallization after an amorphous MgO has been deposited by sputtering, thereby eliminating the need for large-sized equipment.

Figure 11:
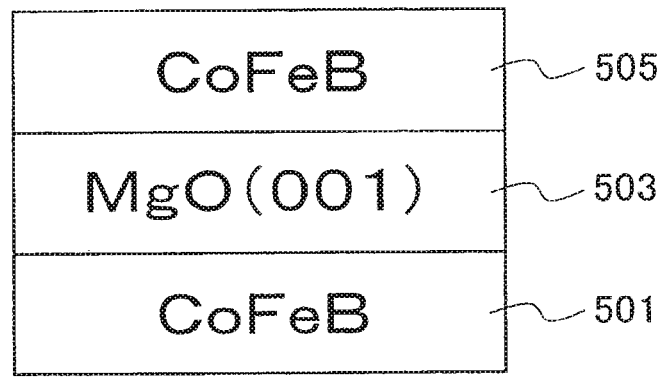
FIG. 11 shows the structure of a MTJ device according to a variation of the invention, corresponding to FIG. 1(B).

Hereafter, a MTJ device according to a variation of the embodiments of the invention will be described with reference to the drawings. FIG. 11 shows the structure of the MTJ device according to the variation, which corresponds to FIG. 1(B). As shown in FIG. 11, the MTJ device of the variation is characterized in that, as in the MTJ device of the above-described embodiments, the electrodes disposed on either side of a single-crystal $MgO_x$ (001) layer 503 or an oxygen-deficit poly-crystal $MgO_x$ (0<x<1) in which the (001) crystal plane is preferentially oriented comprises an amorphous ferromagnetic alloy, such as CoFeB layers 501 and 505. The amorphous ferromagnetic alloy can be formed by evaporation or sputtering, for example. The resultant characteristics are substantially identical to those of the first embodiment.

As the amorphous magnetic alloy, FeCoB, FeCoBSi, FeCoBP, FeZr, and CoZr may be used, for example. Although an anneal process after the preparation of the MTJ device might cause the amorphous magnetic alloy in the electrode layers to be partially or entirely crystallized, this would not lead to a significant deterioration of the MR ratio. Thus, such a crystallized amorphous magnetic alloy may be used in the electrode layers.

While the MTJ device according to various embodiments of the invention has been described, it should be apparent to those skilled in the art that the invention is not limited to those specific embodiments and various other modifications, improvements and combinations are possible. For example, the height of the tunnel barrier may be adjusted by doping Ca or Sr, instead of introducing an oxygen vacancy defects to the MgO layer. Further, while the MgO layer has been described to be deposited by electron-beam evaporation or sputtering, it should be obvious that other deposition methods are also possible. The term "high vacuum" refers to values on the order of no more than 10.6 Pa in the case where oxygen is not introduced, for example. In the case where oxygen is introduced, the term refers to values on the order of $10^{-4}$ Pa.

In accordance with the invention, a larger magnetoresistance than in the conventional MTJ device can be obtained, and the output voltage of the MTJ device can be increased. At the same time, the resistance value of the MTJ device can be reduced so that it is optimized for MRAM. The invention thus enables the level of integration of MRAM using the MTJ device to be readily increased. In accordance with the invention, the output voltage value of the MRAM roughly doubles over prior art, making the MTJ device of the invention suitable for very large scale integrated MRAMs of gigabit class.

What is claimed is:

1. A method of manufacturing a magnetoresistive random access memory (MRAM) comprising memory cells disposed at intersections of word lines and bit lines, each of the memory cells comprising a transistor connected with one of the word lines and a magnetic tunnel junction (MTJ) device connected with one of the bit lines, the method comprising:

forming a first CoFeB layer of the MTJ devices, the first CoFeB layer being amorphous;

forming a magnesium oxide (MgO) layer of the MTJ devices over the first CoFeB layer;

forming a second CoFeB layer of the MTJ devices, the second CoFeB layer being amorphous over the MgO layer; and annealing the MTJ devices, wherein the first and second CoFeB layers are crystallized by the annealing, and wherein the MgO layer is poly-crystalline in which a (001) crystal plane is preferentially oriented.

2. The method of claim 1, wherein after the annealing, the first and second CoFeB layers are entirely crystallized.

3. The method of claim 1, wherein after the annealing, each of the first and second CoFeB layers is poly-crystalline in which a (001) crystal plane is preferentially oriented and each of the first and second CoFeB layers includes a BCC (body-centered cubic) structure.

4. The method of claim 1, wherein after the annealing, the first and second CoFeB layers are entirely crystallized, and each of the first and second CoFeB layers is poly-crystalline in which a (001) crystal plane is preferentially oriented and each of the first and second CoFeB layers includes a BCC (body-centered cubic) structure.

5. The method of claim 1, wherein in the forming the MgO layer, the MgO layer is formed as a MgOx (0<x<1) layer.

6. The method of claim 1, wherein in the forming the MgO layer, the MgO layer is formed directly on the first CoFeB layer.

7. The method of claim 1, wherein:

in the forming the MgO layer, the MgO layer is formed directly on the first CoFeB layer, and in the forming the second CoFeB layer, the second CoFeB layer is formed directly on the MgO layer.

8. The method of claim 1, wherein after the annealing, the MTJ devices are (001) oriented poly-crystal MTJ devices.

9. A method of manufacturing a magnetoresistive random access memory (MRAM) comprising memory cells, each of the memory cells comprising a transistor and a magnetic tunnel junction (MTJ) device, the method comprising:

forming a first ferromagnetic layer of the MTJ devices, the first ferromagnetic layer including a first CoFeB layer that is amorphous;

forming a barrier layer of the MTJ devices, the barrier layer including a magnesium oxide (MgO) layer to have a poly-crystalline state in which a (001) crystal plane is preferentially oriented over the first ferromagnetic layer;

forming a second ferromagnetic layer of the MTJ devices, the second ferromagnetic layer including a second CoFeB layer that is amorphous over the barrier layer; and annealing the MTJ devices to crystallize the first and second CoFeB layers.

10. The method of claim 9, wherein after the annealing, the first and second CoFeB layers are entirely crystallized.

11. The method of claim 9, wherein after the annealing, the first and second CoFeB layers are entirely crystallized, and each of the first and second CoFeB layers is poly-crystalline in which a (001) crystal plane is preferentially oriented and each of the first and second CoFeB layers includes a BCC (body-centered cubic) structure.

12. The method of claim 9,
wherein in the forming the barrier layer, the value of x in MgOx for the MgO layer is greater than 0 and less than 1.

13. The method of claim 9, wherein:
in the forming the barrier layer, the barrier layer is formed directly on the first ferromagnetic layer, and
in the forming the second ferromagnetic layer, the second ferromagnetic layer is formed directly on the barrier layer.

14. The method of claim 9,
wherein after the annealing, the MTJ devices are (001) oriented poly-crystal MTJ devices.

15. A method of manufacturing a magnetoresistive random access memory (MRAM) comprising:
forming transistors on a Si substrate;
forming word lines;
forming a first CoFeB layer of magnetic tunnel junction (MTJ) devices, the first CoFeB layer being amorphous;
forming a magnesium oxide (MgO) layer of the MTJ devices over the first CoFeB layer;
forming a second CoFeB layer of the MTJ devices, the second CoFeB layer being amorphous over the MgO layer;
forming bit lines which intersect with the word lines at intersections, regions of the intersections including one of the transistors and one of the MTJ devices; and
annealing the MTJ devices to form (001) oriented poly-crystal MTJ devices.

16. The method of claim 15,
wherein after the annealing, the first and second CoFeB layers are entirely crystallized.

17. The method of claim 15, wherein after the annealing, the first and second CoFeB layers are entirely crystallized, and
each of the first and second CoFeB layers is poly-crystalline in which a (001) crystal plane is preferentially oriented and each of the first and second CoFeB layers includes a BCC (body-centered cubic) structure.

18. The method of claim 15,
wherein in the forming the MgO layer, the MgO layer is formed as a MgOx ($0<x<1$) layer.

19. The method of claim 15,
wherein in the forming the MgO layer, the MgO layer is poly-crystalline in which a (001) crystal plane is preferentially oriented.

20. The method of claim 15,
wherein the MgO layer is poly-crystalline in which a (001) crystal plane is preferentially oriented.

* * * * *

UNITED STATES PATENT AND TRADEMARK OFFICE
CERTIFICATE OF CORRECTION

PATENT NO. : 11,233,193 B2  
APPLICATION NO. : 16/862598  
DATED : January 25, 2022  
INVENTOR(S) : Yuasa Page 1 of 1

It is certified that error appears in the above-identified patent and that said Letters Patent is hereby corrected as shown below:

On the Title Page

Item (54) and in the Specification, Column 1, Line 1, change --METHOD OF MANUFACTURING A MAGNETORESTIVE RANDOM ACCESS MEMEORY (MRAM)-- to "METHOD OF MANUFACTURING A MAGNETORESISTIVE RANDOM ACCESS MEMORY (MRAM)".

Signed and Sealed this  
Twenty-fourth Day of May, 2022

Katherine Kelly Vidal  
*Director of the United States Patent and Trademark Office*